US010468284B2

(12) United States Patent
Kuwahara

(10) Patent No.: US 10,468,284 B2
(45) Date of Patent: Nov. 5, 2019

(54) SUBSTRATE PROCESSING APPARATUS AND SUBSTRATE PROCESSING METHOD

(71) Applicant: SCREEN Holdings Co., Ltd., Kyoto (JP)

(72) Inventor: Joji Kuwahara, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 183 days.

(21) Appl. No.: 15/793,260

(22) Filed: Oct. 25, 2017

(65) Prior Publication Data

US 2018/0047603 A1 Feb. 15, 2018

Related U.S. Application Data

(62) Division of application No. 14/699,023, filed on Apr. 29, 2015, now abandoned.

(30) Foreign Application Priority Data

Apr. 30, 2014 (JP) .................................. 2014-094151

(51) Int. Cl.
*H01L 21/68* (2006.01)
*H01L 21/677* (2006.01)
(Continued)

(52) U.S. Cl.
CPC ........ *H01L 21/68* (2013.01); *H01L 21/67703* (2013.01); *H01L 21/67748* (2013.01); *H01L 21/683* (2013.01); *H05K 13/0015* (2013.01)

(58) Field of Classification Search
CPC ..... B25J 9/04; B25J 9/041; B25J 9/042; B25J 9/1638; B25J 9/1641; B25J 9/1648;
(Continued)

(56) References Cited

U.S. PATENT DOCUMENTS 6,092,678 A * 7/2000 Kawano ............ H01L 21/67733
212/286
2003/0023343 A1* 1/2003 Tomita .............. H01L 21/67259
700/221
(Continued)

FOREIGN PATENT DOCUMENTS

JP 11-163083 6/1999
JP 11-349280 A 12/1999
(Continued)

OTHER PUBLICATIONS

Chinese Office Action dated Jun. 16, 2017 in counterpart Taiwanese Patent Application No. 104115906.
(Continued)

*Primary Examiner* — Saul Rodriguez
*Assistant Examiner* — Brendan P Tighe
(74) *Attorney, Agent, or Firm* — Ostrolenk Faber LLP

(57) ABSTRACT

One or plurality of correction information corresponding to one or plurality of spin chucks are acquired in advance for adjustment of a position of a substrate by an aligner and are stored in a memory. Each correction information indicates a position to be adjusted by the aligner when the substrate is transported from the aligner to each spin chuck by a transport mechanism in order for a center of the transported substrate to coincide with a rotational center of the spin chuck. The position of the substrate is adjusted by the aligner based on the correction information, corresponding to the spin chuck, stored in the memory before the substrate is transported to any one of the spin chucks from the aligner during processing for the substrate.

11 Claims, 18 Drawing Sheets

(51) Int. Cl.
*H01L 21/683* (2006.01)
*H05K 13/00* (2006.01)

(58) Field of Classification Search
CPC ..... B25J 9/1664; B25J 19/021; B65G 47/244; B65G 47/248; B65G 2203/044; G05B 2219/45031; H01L 21/67259; H01L 21/67703; H01L 21/67715; H01L 21/67718; H01L 21/67739; H01L 21/67742; H01L 21/67745; H01L 21/67748; H01L 21/68; H01L 21/681; H01L 21/68707; H01L 2223/54493; H05K 13/0015
USPC ....... 414/222.01, 744.2, 744.3, 751.1, 753.1, 414/935; 700/245, 250, 251; 901/9, 15, 901/20, 23
See application file for complete search history.

(56) References Cited

U.S. PATENT DOCUMENTS

| 2005/0078312 | A1* | 4/2005 | Fukuzaki | H01L 21/68 356/399 |
| 2006/0100740 | A1* | 5/2006 | Sakiya | B25J 9/1692 700/246 |
| 2009/0222135 | A1* | 9/2009 | Asakawa | H01L 21/67769 700/253 |
| 2012/0135148 | A1* | 5/2012 | Deguchi | H01L 21/6708 427/372.2 |
| 2012/0316678 | A1 | 12/2012 | Asakawa et al. | 700/251 |
| 2014/0023776 | A1* | 1/2014 | Kuwahara | H01L 21/67259 427/8 |

FOREIGN PATENT DOCUMENTS

| JP | 2003-152055 A | 5/2003 |
| JP | 2009-212130 A | 9/2009 |
| JP | 2012-119370 A | 6/2012 |
| JP | 2014-022589 | 2/2014 |
| TW | 201232191 A1 | 8/2012 |

OTHER PUBLICATIONS

Notice of Reasons for Refusal dated Nov. 21, 2017 for counterpart Japanese Patent Application No. 2014-094151.

* cited by examiner

FIG. 11
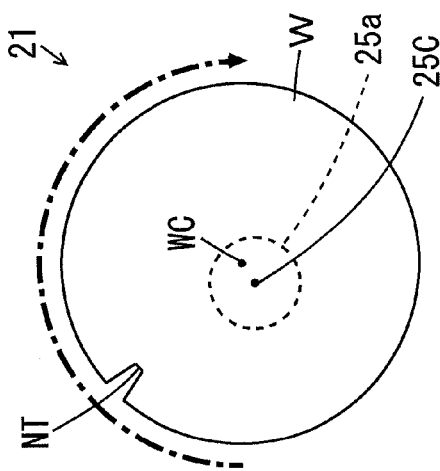
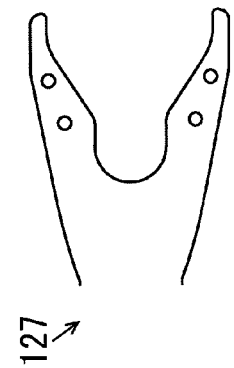
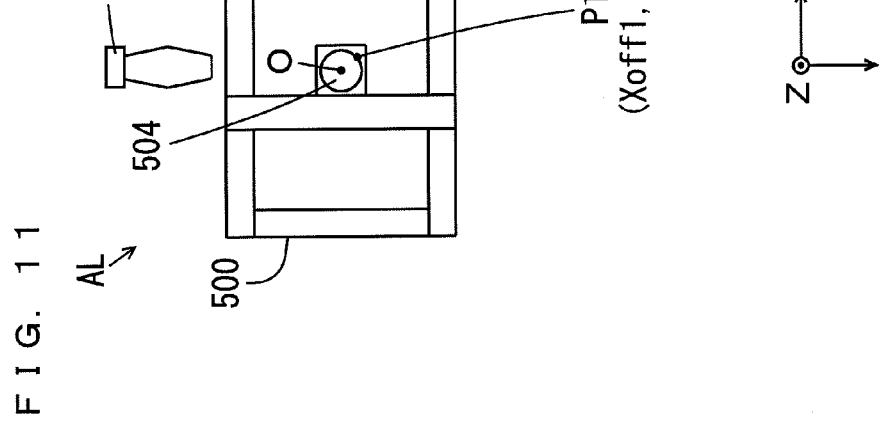

F I G. 13
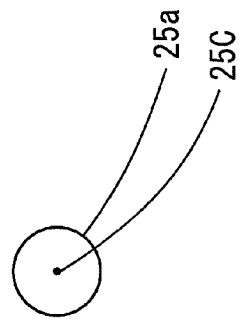
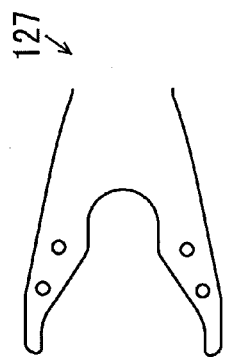
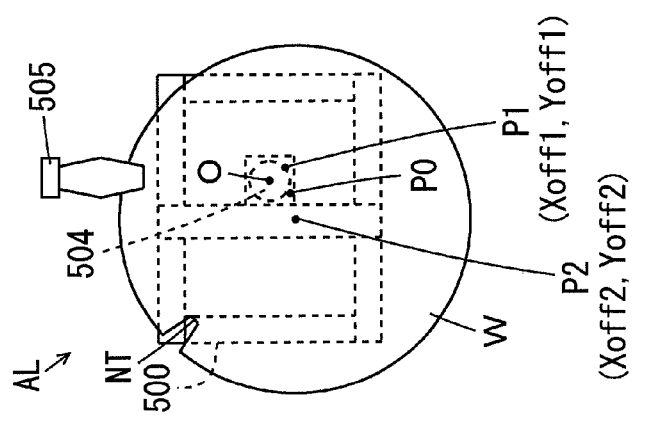

FIG. 16
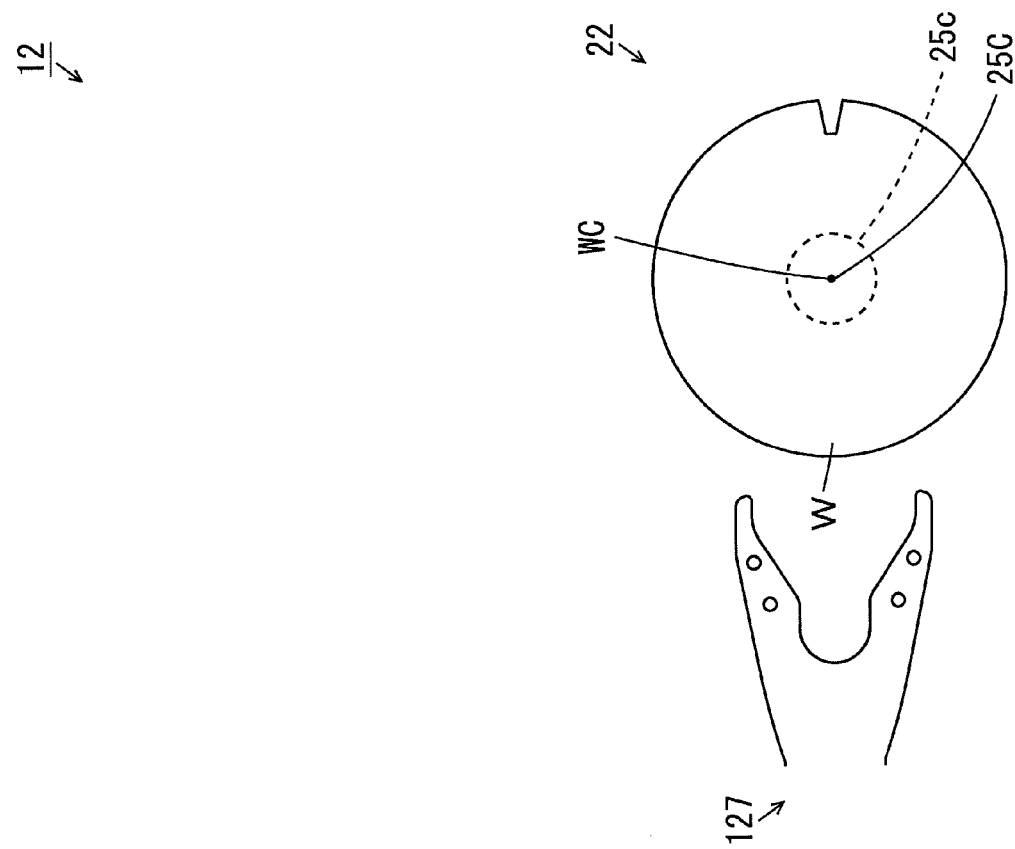
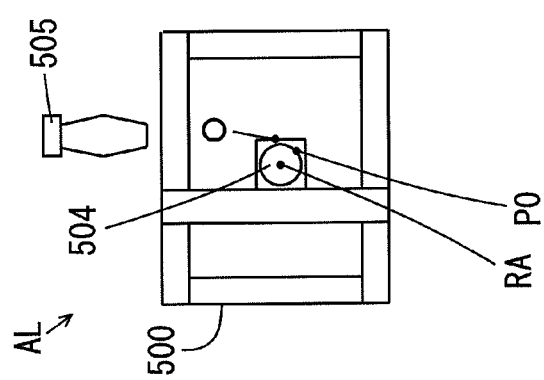
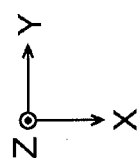

FIG. 19
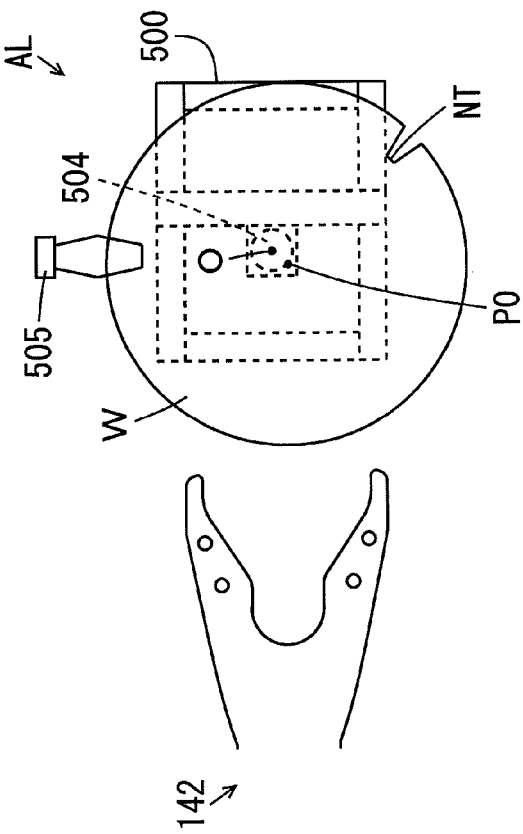
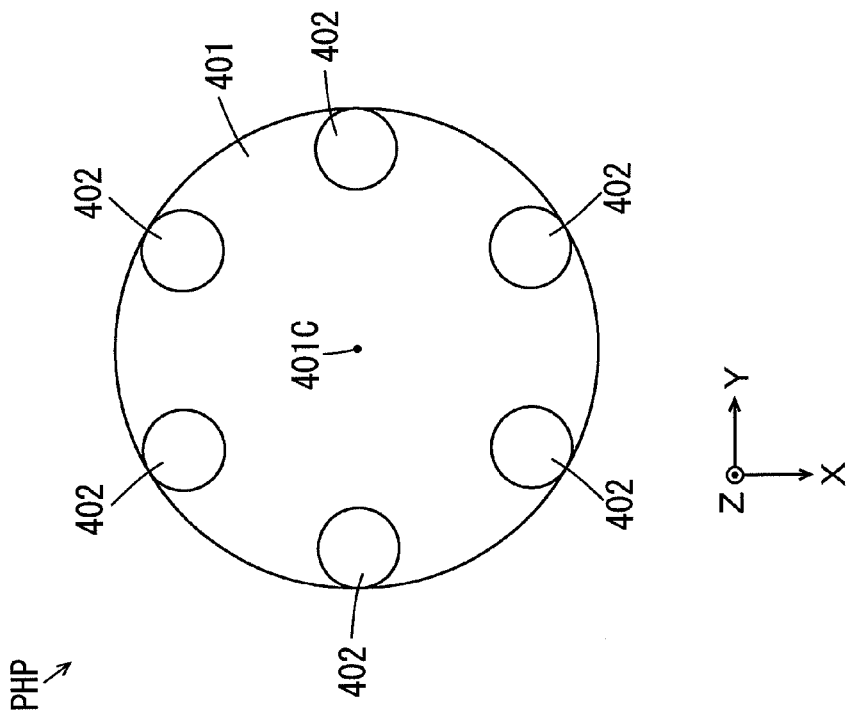

SUBSTRATE PROCESSING APPARATUS AND SUBSTRATE PROCESSING METHOD

CROSS REFERENCE TO RELATED APPLICATIONS

This application is a divisional of U.S. patent application Ser. No. 14/699,023, filed Apr. 29, 2015, which claims the benefit of Japanese Patent Application No. 2014-094151, filed Apr. 30, 2014, which is incorporated herein by reference.

BACKGROUND OF THE INVENTION

Field of the Invention

The present invention relates to a substrate processing apparatus and a substrate processing method.

Description of Related Art

Substrate processing apparatuses are used to subject various types of substrates such as semiconductor substrates, substrates for liquid crystal displays, plasma displays, optical disks, magnetic disks, magneto-optical disks, and photomasks, and other substrates to various types of processing. In such a substrate processing apparatus, a plurality of substrates are sequentially transported by a transport device to a predetermined substrate supporter in a processing section. The processing section performs predetermined processing on the substrate transported to the substrate supporter. It is desired that the substrate is supported by the substrate supporter with a center of the substrate accurately coinciding with a desired position in the substrate supporter in order to improve accuracy of processing for the substrate.

In a substrate processing apparatus described in JP 11-163083 A, teaching is performed on a transport device, so that deviation between a position, in the substrate supporter, at which the substrate is to be supported and a position at which the substrate is actually supported is corrected. In the teaching, a jig including an optical sensor is held by an arm of the transport device. Here, three pins are formed at the substrate supporter. The jig that is held by the arm is brought closer to the three pins until the jig and the arm have a predetermined relative positional relationship. In this state, the arm is moved in a plurality of predetermined directions, so that positions of two pins of the three pins are detected as position information by the optical sensor of the jig. The position of the substrate supporter to which the arm accesses is set based on the detected position information.

BRIEF SUMMARY OF THE INVENTION

Even in a case in which the teaching described in JP 11-163083 A is performed on the transport device, when a distance of transportation of the transport device is large, deviation between the substrate and the substrate supporter is sometimes increased.

An object of the present invention is to provide a substrate processing apparatus and a substrate processing method capable of transporting a substrate to a substrate supporter such that deviation between the substrate and the substrate supporter is reduced regardless of a distance of transportation of a transport device.

(1) A substrate processing apparatus according to one aspect of the present invention that performs processing on a substrate includes one or plurality of substrate supporters that have preset reference positions and support the substrate, a position adjustor that is configured to be capable of adjusting a position of the substrate that is carried in, a transport device that is configured to be capable of transporting the substrate between the position adjuster and the one or plurality of substrate supporters, a storage that stores one or plurality of correction information, corresponding to the one or plurality of substrate supporters, acquired in advance for the adjustment of the position of the substrate by the position adjustor and a controller that controls the position adjustor to adjust the position of the substrate before the substrate is transported from the position adjuster to one substrate supporter of the one or plurality of substrate supporters during the processing for the substrate based on correction information, corresponding to the one substrate supporter, of the one or plurality of correction information stored in the storage, wherein each of the one or plurality of correction information indicates the position to be adjusted by the position adjustor when the substrate is transported from the position adjustor to each of the one or plurality of substrate supporters by the transport device in order for a center of the transported substrate to coincide with the reference position in the substrate supporter.

In this substrate processing apparatus, the one or plurality of correction information corresponding to the one or plurality of substrate supporters are acquired in advance for the adjustment of the position of the substrate by the position adjustor and are stored in the storage. Each of the one or plurality of correction information indicates the position to be adjusted by the position adjustor when the substrate is transported to each of the one or plurality of substrate supporters from the position adjuster by the transport device in order for the center of the transported substrate to coincide with the reference position in the substrate supporter.

During the processing for the substrate, the position of the substrate is adjusted by the position adjuster before the substrate is transported to the one substrate supporter of the one or plurality of substrate supporters from the position adjuster based on the correction information, corresponding to the one substrate supporter, of the one or plurality of correction information that are stored in the storage. The substrate of which the position is adjusted by the position adjuster is transported to the one substrate supporter by the transport device.

This configuration causes the one or plurality of correction information for adjusting the position of the substrate by the position adjustor to be acquired in advance and to be stored in the storage. Therefore, the alignment for coincidence of the center of the substrate with the reference position of each substrate supporter is performed by the position adjustor before the transportation of the substrate. Thus, during the processing for the substrate, the substrate transported to the one substrate supporter by the transport device is supported by the substrate supporter with the center of the substrate coinciding with the reference position in the substrate supporter. In this case, it is not necessary to perform the teaching on the transport device for the coincidence of the center of the substrate to with the reference position of the substrate supporter. Therefore, a large amount of time, which an operator conventionally requires for the teaching operation, can be reduced, and work efficiency of the substrate processing apparatus can be improved. Further, the substrate can be transported to each substrate supporter such that deviation between the substrate and each substrate supporter is reduced regardless of the distance of transportation of the transport device.

(2) Each of the one or plurality of correction information may include a position with which the center of the substrate is to coincide in the position adjustor before the transportation of the substrate to each of the one or plurality of substrate supporters as a correction position, and the controller may control the position adjustor such that the center of the substrate coincides with the correction position corresponding to the one substrate supporter before the transportation of the substrate to the one substrate supporter.

In this case, the position of the substrate is adjusted such that the center of the substrate coincides with the correction position corresponding to the one substrate supporter before the transportation of the substrate. Thus, the substrate can be transported to the substrate supporter such that the center of the substrate coincides with the reference position of the one substrate supporter.

(3) Each of the one or plurality of substrate supporters may include a first rotation holding device that holds the substrate in a horizontal attitude and rotates the substrate about a rotation axis, the position adjustor may have a reference axis and be configured to detect an amount of deviation between the center of the substrate that is carried in and the reference axis, the controller may control the transport device such that the substrate is transported from the position adjustor to each substrate supporter, may control the first rotation holding device such that the transported substrate is rotated by a predetermined angle, may control the transport device such that the substrate is transported from the substrate supporter to the position adjustor, may detect an amount of deviation detected by the position adjustor before the transportation from the position adjuster to each substrate supporter as a first amount of deviation, may detect an amount of deviation detected by the position adjustor after the transportation from the substrate supporter to the position adjustor as a second amount of deviation and may calculate the correction position based on the first and second amounts of deviation, during acquisition of the correction information, wherein the storage may store the one or plurality of correction positions, corresponding to the one or plurality of substrate supporters, calculated by the controller as the one or plurality of correction information.

In this case, the amounts of deviation between the center of the substrate and the reference axis before and after the rotation by the first rotation holding device can be easily detected as the first and second amounts of deviation. Further, the correction position can be calculated by a geometric operation based on the first and second amounts of deviation. As a result, the one or plurality of correction information can be acquired in advance during the acquisition of the correction information before the processing for the substrate and can be stored in the storage.

(4) The predetermined angle may be 180 degrees. In this case, the correction position can be easily calculated based on the first and second amounts of deviation.

(5) Each of the one or plurality of substrate supporters may be configured to perform the processing on the substrate rotated by the first rotation holding device during the processing for the substrate.

In this case, the processing is performed on the substrate rotated by the first rotation holding device with the center of the substrate coinciding with the reference position of each substrate supporter. Thus, accuracy of the processing for the substrate can be improved.

(6) Each of the one or plurality of substrate supporters may include a guide mechanism that leads a position of the center of the substrate to the reference position, the position adjustor may have a reference axis and be configured to detect an amount of deviation between the center of the substrate that is carried in and the reference axis, the position of the center of the substrate may be led to the reference position by the guide mechanism in each of the one or plurality of substrate supporters during acquisition of the correction information, the controller may control the transport device such that the substrate is transported from each of the one or plurality of substrate supporters to the position adjustor, may acquire an amount of deviation detected by the position adjustor after transportation from the substrate supporter to the position adjustor and may calculate the correction position based on the acquired amount of deviation, during acquisition of the correction information, and the storage may store the one or plurality of correction positions, corresponding to the one or plurality of substrate supporters, calculated by the controller as the one or plurality of correction information.

In this case, during the acquisition of the correction information, the substrate is supported with the position of the center of the substrate being led to the reference position by the guide mechanism. Therefore, the substrate is transported to the position adjustor, so that the correction information can be easily calculated. Thus, the one or plurality of correction information can be acquired in advance during the acquisition of the correction information before the processing for the substrate and can be stored in the storage.

(7) Each of the one or plurality of substrate supporters may be configured to perform temperature processing on the substrate during the processing for the substrate.

In this case, the temperature processing is performed on the substrate with the center of the substrate coinciding with the reference position of each substrate supporter. Thus, accuracy of the temperature processing for the substrate can be improved.

(8) The position adjustor may include a substrate holder that holds the substrate, a moving device that moves the substrate holder in a two-dimensional direction that is orthogonal to the reference axis, and a position detector that detects a position of an outer periphery of the substrate held by the substrate holder, and the controller may calculate a position of the center of the substrate based on the position of the outer periphery of the substrate detected by the position detector, and may control the moving device based on the calculated position of the center of the substrate such that the center of the substrate held by the substrate holder coincides with the correction position corresponding to the one substrate supporter, before the transportation of the substrate to the one substrate supporter during the processing for the substrate.

In this case, the position of the center of the substrate can be calculated with a simple configuration, and the position of the center of the substrate can coincide with each correction position.

(9) Each of the one or plurality of substrate supporters may have a preset reference direction, the position adjuster may be configured to be capable of adjusting a direction of the substrate that is carried in, and each of the one or plurality of correction information may include a direction to be adjusted by the position adjustor when the substrate is transported to each of the one or plurality of substrate supporters from the position adjuster in order for a direction of the transported substrate to coincide with the reference direction in the substrate supporter.

In this case, the alignment for coincidence of the direction of the substrate with the reference direction of each substrate supporter is performed by the position adjustor before the transportation of the substrate. Thus, the transport device can transport the substrate to each substrate supporter such that the direction of the substrate coincides with the reference direction of each substrate supporter. As a result, the accuracy of the processing for the plurality of substrates can be uniform.

(10) Each of the one or plurality of correction information may include a direction with which a direction of a notch of the substrate is to coincide in the position adjuster before the transportation of the substrate to each of the one or plurality of substrate supporters as a correction direction, and the controller may control the position adjustor such that the direction of the notch of the substrate coincides with the correction direction corresponding to the one substrate supporter, before the transportation of the substrate to the one substrate supporter.

In this case, the position of the substrate is adjusted such that the direction of the notch of the substrate coincides with the correction direction corresponding to the one substrate supporter before the transportation of the substrate. Thus, the substrate can be transported to the substrate supporter such that the direction of the notch of the substrate coincides with the reference direction of the one substrate supporter.

(11) The position adjuster may include a second rotation holding device that holds the substrate in a horizontal attitude and rotates the substrate about a rotation axis, a moving device that moves the second rotation holding device in a two-dimensional direction that is orthogonal to the reference axis, and a position detector that detects a position of an outer periphery of the substrate rotated by the second rotation holding device, and the controller may calculate the position of the center of the substrate and the direction of the notch of the substrate based on the position of the outer periphery of the substrate detected by the position detector, may control the second rotation holding device and the moving device based on the calculated position of the center of the substrate and the calculated direction of the notch of the substrate such that the center of the substrate held by the second rotation holding device coincides with the correction position corresponding to the one substrate supporter, and may control the second rotation holding device and the moving device based on the calculated position of the center of the substrate and the calculated direction of the notch of the substrate such that the direction of the notch of the substrate held by the second rotation holding device coincides with the connection direction corresponding to the one substrate supporter, before the transportation of the substrate to the one substrate supporter during the processing for the substrate.

In this case, the position of the center of the substrate can be calculated with a simple configuration, the position of the center of the substrate can coincide with each correction position, and the direction of the notch of the substrate can coincide with each correction direction.

(12) A substrate processing method according to another aspect of the present invention for performing processing on a substrate, including the steps of storing one or plurality of correction information, corresponding to one or plurality of substrate supporters, acquired in advance for adjustment of a position of the substrate by a position adjustor, adjusting the position of the substrate by the position adjustor based on the correction information, corresponding to one substrate supporter, of the one or plurality of correction information stored in the storage before the substrate is transported from the position adjustor to the one substrate supporter of the one or plurality of substrate supporters during the processing for the substrate, transporting the substrate of which the position is adjusted by the position adjustor to the one substrate supporter by a transport device, wherein each of the one or plurality of correction information indicates the position to be adjusted by the position adjustor when the substrate is transported to each of the one or plurality of substrate supporters from the position adjustor by the transport device in order for a center of the transported substrate to coincide with a reference position in the substrate supporter.

In this substrate processing method, the one or plurality of correction information corresponding to the one or plurality of substrate supporters are acquired in advance for the adjustment of the position of the substrate by the position adjustor and are stored in the storage. Each of the one or plurality of correction information indicates the position to be adjusted by the position adjustor when the substrate is transported to each of the one or plurality of substrate supporters from the position adjustor by the transport device in order for the center of the transported substrate to coincide with the reference position in the substrate supporter.

The position of the substrate is adjusted by the position adjustor based on the correction information, corresponding to the one substrate supporter, of the one or plurality of correction information stored in the storage before the substrate is transported from the position adjustor to the one substrate supporter of the one or plurality of substrate supporters during the processing for the substrate. The substrate of which the position is adjusted by the position adjustor is transported to the one substrate supporter by the transport device.

This configuration causes the one or plurality of correction information for adjustment of the position of substrate by the position adjustor to be acquired in advance and to be stored in the storage. Therefore, the alignment for coincidence of the center of the substrate with the reference position of each substrate supporter is performed by the position adjustor before the transportation of the substrate. Thus, the substrate that is transported to the one substrate supporter by the transport device is supported by the substrate supporter with the center of the substrate coinciding with the reference position in the substrate supporter, during the processing for the substrate. In this case, it is not necessary to perform the teaching on the transport device for the coincidence of the center of the substrate with the reference position of the substrate supporter. Therefore, a large amount of time, which the worker conventionally requires for the teaching operation, can be reduced, and work efficiency of the substrate processing apparatus can be improved. Further, the substrate can be transported to each substrate supporter such that the deviation between the substrate and each substrate supporter is reduced regardless of the distance of transportation of the transport device.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 11 is a diagram for explaining the steps of acquiring the correction information;

FIG. 13 is a diagram for explaining the steps of acquiring the correction information;

FIG. 16 is a diagram for explaining the alignment for the substrate in the substrate processing in the first processing block;

FIG. 19 is a diagram for explaining the steps of acquiring the correction information in the second embodiment.

DESCRIPTION OF THE PREFERRED EMBODIMENTS

[1] First Embodiment

A substrate processing apparatus according to the first embodiment will be described with reference to the drawings. In the following description, a substrate refers to a semiconductor substrate, a substrate for a liquid crystal display, a substrate for a plasma display, a substrate for an optical disk, a substrate for a magnetic disk, a substrate for a magneto-optical disk, a substrate for a photomask or the like.

In the substrate used in the present embodiment, at least part of the substrate has a circular outer periphery. The outer periphery except for a notch for positioning is circular, for example.

(1) Overall Configuration

Figure 1:
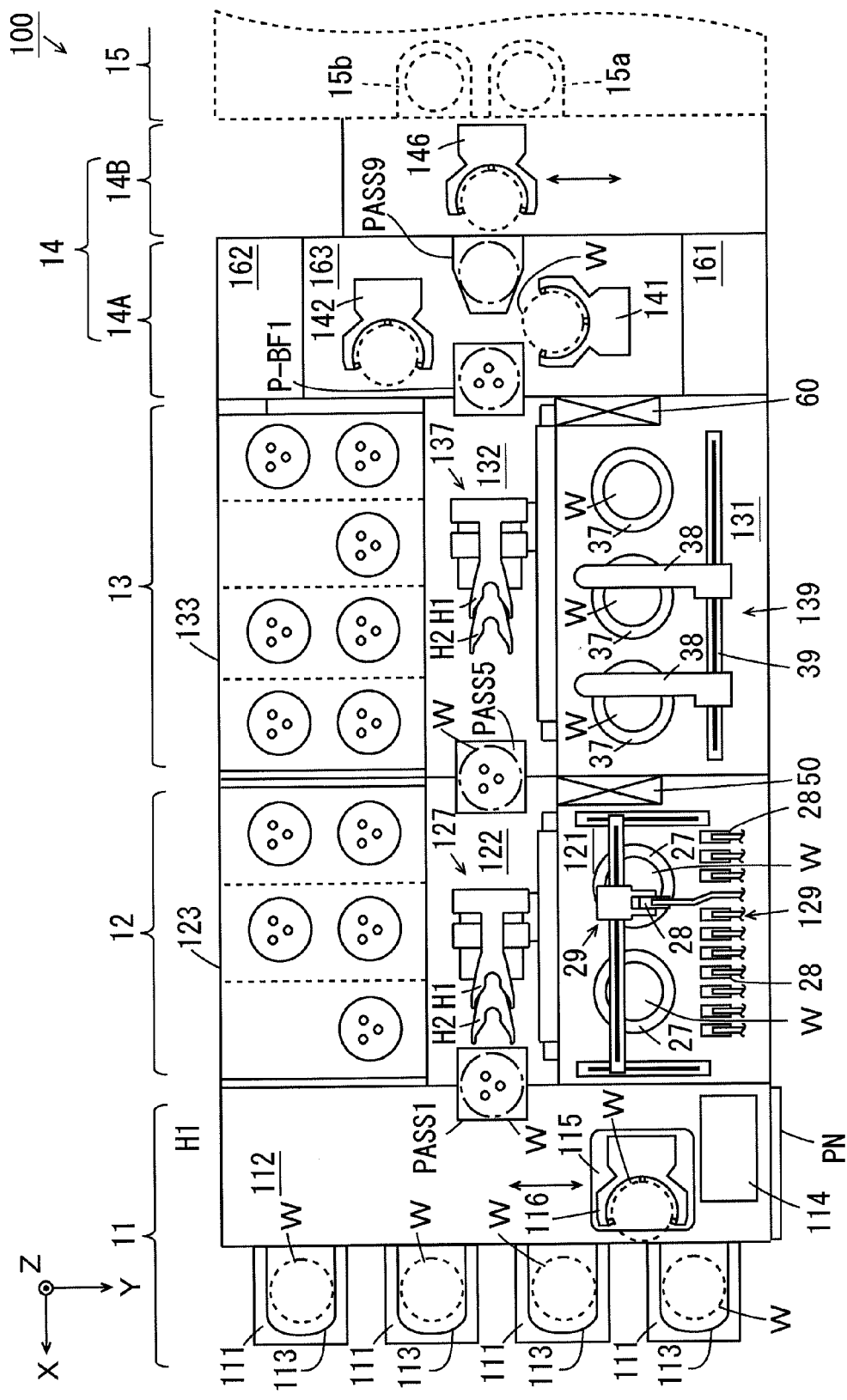
FIG. 1 is a schematic plan view showing a configuration of a substrate processing apparatus.

FIG. 1 is a schematic plan view showing a configuration of the substrate processing apparatus 100. FIG. 1 and subsequently given diagrams are accompanied by arrows that indicate X, Y, and Z directions orthogonal to one another for clarity of a positional relationship as needed. The X and Y directions are orthogonal to each other within a horizontal plane, and the Z direction corresponds to a vertical direction.

As shown in FIG. 1, the substrate processing apparatus 100 includes an indexer block 11, a first processing block 12, a second processing block 13, a cleaning drying processing block 14A and a carry-in carry-out block 14B. An interface block 14 is constituted by the cleaning drying processing block 14A and the carry-in carry-out block 14B. An exposure device 15 is arranged to be adjacent to the carry-in carry-out block 14B. In the exposure device 15, exposure processing is performed on the substrate W using a liquid immersion method.

The indexer block 11 includes a plurality of carrier platforms 111 and a transport section 112. In each carrier platform 111, a carrier 113 for storing a plurality of substrates W in multiple stages is placed. In the transport section 112, a controller 114 and a transport mechanism 115 are provided. The controller 114 controls various constituent elements of the substrate processing apparatus 100. The transport mechanism 115 holds and transports the substrate W.

A main panel PN is provided on a side surface of the transport section 112. The main panel PN is connected to the controller 114. A user can confirm the processing status of the substrate W in the substrate processing apparatus 100 and other information on the main panel PN. An operation unit (not shown) composed of a keyboard, for example, is provided near the main panel PN. The user can set operation settings of the substrate processing apparatus 100, for example, by operating the operation unit.

The first processing block 12 includes a coating processing section 121, a transport section 122 and a thermal processing section 123. The coating processing section 121 and the thermal processing section 123 are provided to be opposite to each other with the transport section 122 sandwiched therebetween. As described below, substrate platforms PASS1 and below-mentioned substrate platforms PASS2 to PASS4 (see FIG. 4) on which the substrates W are placed are provided between the transport section 122 and the transport section 112. A transport mechanism 127 and a transport mechanism 128 (see FIG. 4) that is described below, which transport the substrates W, are provided in the transport section 122.

The second processing block 13 includes a development processing section 131, a transport section 132 and a thermal processing section 133. The development processing section 131 and the thermal processing section 133 are provided to be opposite to each other with the transport section 132 sandwiched therebetween. Substrate platforms PASS5 and below-mentioned substrate platforms PASS6 to PASS8 (see FIG. 4) on which the substrates W are placed are provided between the transport section 132 and the transport section 122. A transport mechanism 137 and a transport mechanism 138 (see FIG. 4) that is described below, which transport the substrates W, are provided in the transport section 132.

The cleaning drying processing block 14A includes cleaning drying processing sections 161, 162 and a transport section 163. The cleaning drying processing sections 161, 162 are provided to be opposite to each other with the transport section 163 sandwiched therebetween. Transport mechanisms 141, 142 are provided in the transport section 163. A placement buffer unit P-BF1 and a placement buffer unit P-BF2 (see FIG. 4) that is described below are provided between the transport section 163 and the transport section 132. The placement buffer units P-BF1, P-BF2 are configured to be capable of storing the plurality of substrates W.

Further, a substrate platform PASS9 and placement cooling platforms P-CP (see FIG. 4) that are described below are provided to be adjacent to the carry-in carry-out block 14B between the transport mechanisms 141, 142. Each of placement cooling platform P-CP includes a function of cooling the substrate W. In the placement cooling platform P-CP, the substrate W is cooled to a temperature suitable for the exposure processing.

A transport mechanism 146 is provided in the carry-in carry-out block 14B. The transport mechanism 146 carries in the substrate W to and carries out the substrate W from the exposure device 15. A substrate inlet 15a for carrying in the substrate W and a substrate outlet 15b for carrying out the substrate W are provided at the exposure device 15.

Figure 2:
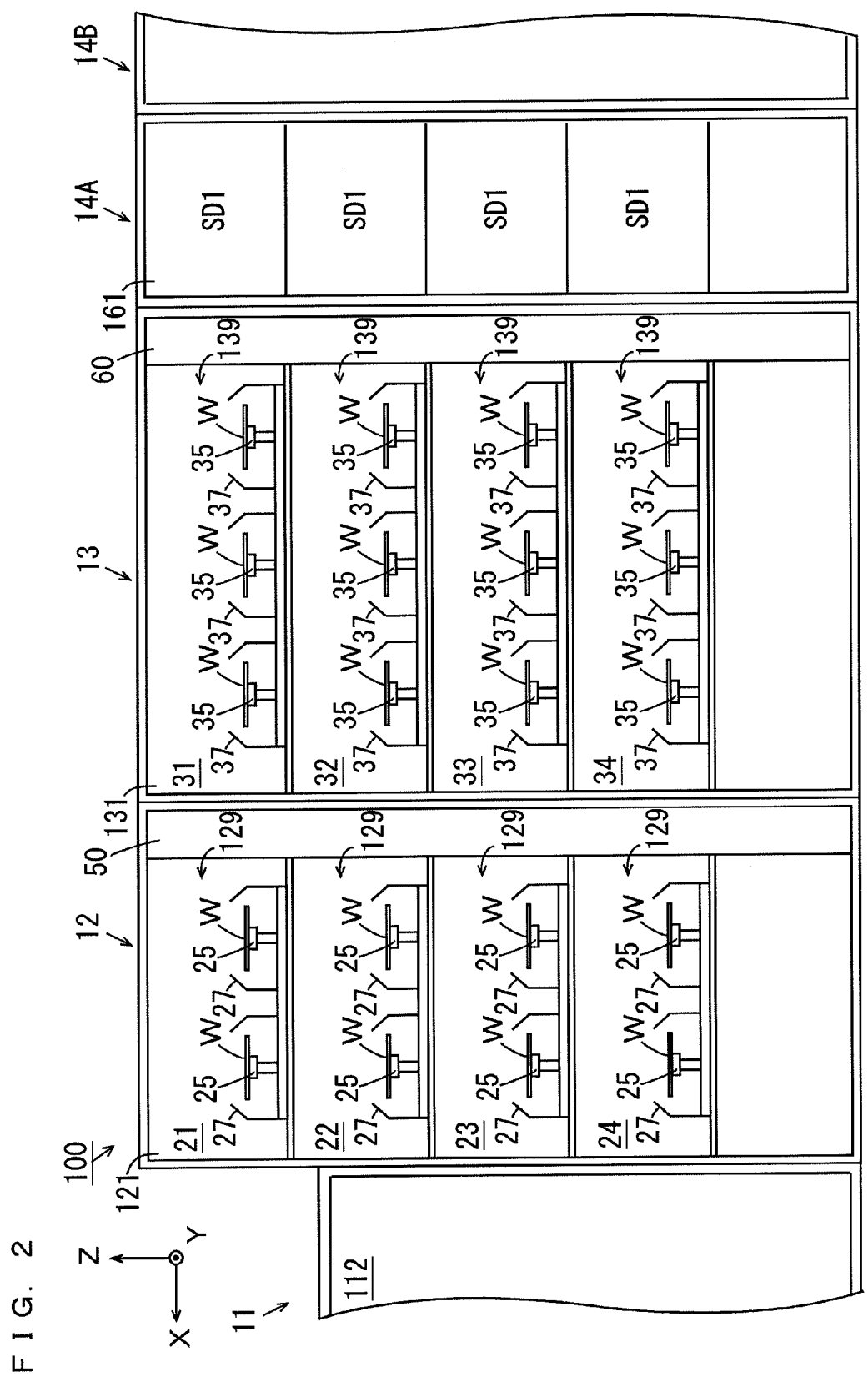
FIG. 2 is a schematic side view of the substrate processing apparatus mainly showing a coating processing section, a development processing section and a cleaning drying processing section of FIG. 1.

(2) Configuration of Coating Processing Section and Development Processing Section FIG. 2 is a schematic side view of the substrate processing apparatus 100 mainly showing the coating processing section 121, the development processing section 131 and the cleaning drying processing section 161 of FIG. 1.

As shown in FIG. 2, in the coating processing section 121, coating processing chambers 21, 22, 23, 24 are provided in a stack. In the development processing section 131, development processing chambers 31, 32, 33, 34 are provided in a stack. In each of the coating processing chambers 21 to 24, a coating processing unit 129 is provided. In each of the development processing chambers 31 to 34, a development processing unit 139 is provided.

Each coating processing unit 129 includes spin chucks 25 that hold the substrates W and cups 27 provided to cover the surroundings of the spin chucks 25. In the present embodiment, two pairs of the spin chucks 25 and the cups 27 are provided at each coating processing unit 129. Each spin chuck 25 is driven to be rotated by a driving device that is not shown (an electric motor, for example). Further, as shown in FIG. 1, each coating processing unit 129 includes a plurality of processing liquid nozzles 28 that discharge a processing liquid and a nozzle transport mechanism 29 that moves these processing liquid nozzles 28.

In the coating processing unit 129, the spin chuck 25 is rotated by the driving device (not shown), any one of the plurality of processing liquid nozzles 28 is moved to a position above the substrate W by the nozzle transport mechanism 29, and a processing liquid is discharged from the processing liquid nozzle 28. Thus, the processing liquid is applied to an upper surface of the substrate W. Further, a rinse liquid is discharged at a peripheral edge of the substrate W from an edge rinse nozzle (not shown). Thus, the processing liquid adhering to the peripheral edge of the substrate W is removed.

In the coating processing unit 129 in the coating processing chamber 22, 24, a processing liquid for an anti-reflection film is supplied to the substrate W from the processing liquid nozzle 28. In the coating processing unit 129 in the coating processing chamber 21, 23, a processing liquid for a resist film is supplied to the substrate W from the processing liquid nozzle 28.

Each development processing unit 139 includes spin chucks 35 and cups 37 similarly to the coating processing unit 129. In the present embodiment, three pairs of the spin chucks 35 and the cups 37 are provided in each development processing unit 139. Each spin chuck 35 is driven to be rotated by a driving device that is not shown (an electric motor, for example). Further, as shown in FIG. 1, the development processing unit 139 includes two development nozzles 38 that discharge a development liquid and a moving mechanism 39 that moves the development nozzles 38 in the X direction.

In the development processing unit 139, the spin chuck 35 is rotated by the driving device (not shown) and the one development nozzle 38 supplies the development liquid to each substrate W while moving in the X direction. Thereafter, the other development nozzle 38 supplies the development liquid to each substrate W while moving. In this case, the development liquid is supplied to the substrate W, so that development processing for the substrate W is performed. Further, in the present embodiment, development liquids that are different from each other are discharged from the two development nozzles 38. Thus, two types of the development liquids can be supplied to each substrate W.

A plurality (four in the present example) of cleaning drying processing units SD1 are provided in the cleaning drying processing section 161. In each cleaning drying processing unit SD1, cleaning and drying processing for the substrate W before the exposure processing are performed.

As shown in FIGS. 1 and 2, a fluid box 50 is provided in the coating processing section 121 to be adjacent to the development processing section 131. Similarly, a fluid box 60 is provided in the development processing section 131 to be adjacent to the cleaning drying processing block 14A. The fluid box 50 and the fluid box 60 each house fluid related elements used to supply a chemical liquid to the coating processing units 129 and the development processing units 139 and discharge the liquid and air out of the coating processing units 129 and the development processing units 139. The fluid related elements include pipes, joints, valves, flowmeters, regulators, pumps, temperature adjusters and the like.

(3) Configuration of Thermal Processing Sections

Figure 3:
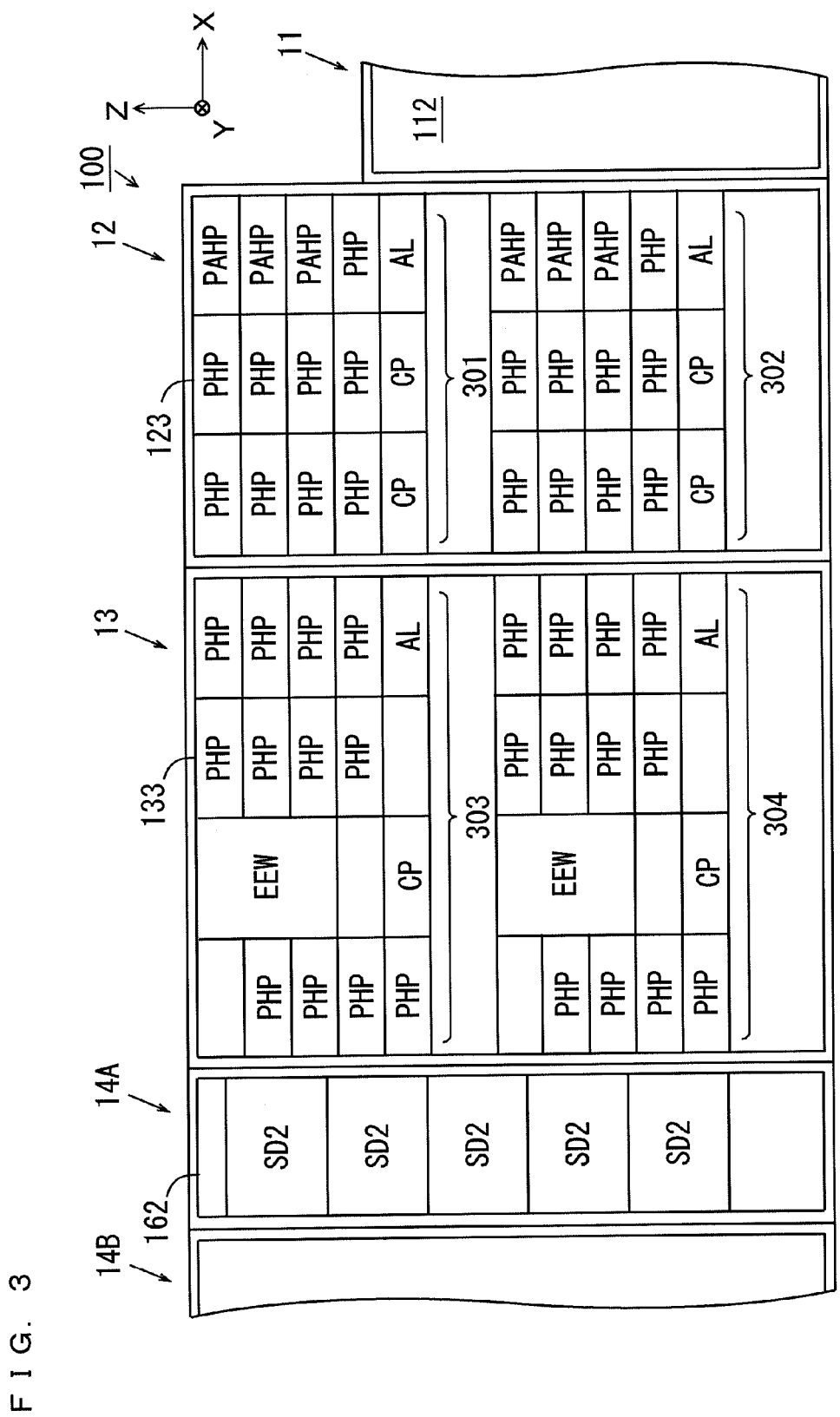
FIG. 3 is a schematic side view of the substrate processing apparatus mainly showing thermal processing sections and a cleaning drying processing section of FIG. 1.

FIG. 3 is a schematic side view of the substrate processing apparatus 100 mainly showing the thermal processing sections 123, 133 and the cleaning drying processing section 162 of FIG. 1.

As shown in FIG. 3, the thermal processing section 123 has an upper thermal processing section 301 provided above, and a lower thermal processing section 302 provided below. In each of the upper thermal processing section 301 and the lower thermal processing section 302, one or plurality of aligners AL, a plurality of thermal processing units PHP, a plurality of adhesion reinforcement processing units PAHP and a plurality of cooling units CP are provided.

The aligner AL has an alignment function for the substrate W. The alignment for the substrate W refers to arranging a direction of the notch formed at the substrate W to coincide with a specific direction with respect to a center of the substrate W and the center of the substrate to coincide with a specific position. Details of the aligner AL will be described below.

In each thermal processing unit PHP, heating processing and cooling processing for the substrate W are performed. Hereinafter, the heating processing and the cooling processing in the thermal processing unit PHP are simply referred to as thermal processing. Adhesion reinforcement processing for improving adhesion between the substrate W and the anti-reflection film is performed in the adhesion reinforcement processing unit PAHP. Specifically, in the adhesion reinforcement processing unit PAHP, an adhesion reinforcement agent such as HMDS (hexamethyldisilazane) is applied to the substrate W, and the heating processing is performed on the substrate W. In each cooling unit CP, the cooling processing for the substrate W is performed.

The thermal processing section 133 has an upper thermal processing section 303 provided above and a lower thermal processing section 304 provided below. One or plurality of aligners AL, a cooling unit CP, an edge exposure unit EEW and a plurality of thermal processing units PHP are provided in each of the upper thermal processing section 303 and the lower thermal processing section 304. In the edge exposure unit EEW, the exposure processing for the peripheral edge of the substrate W (edge exposure processing) is performed. In the upper thermal processing section 303 and the lower thermal processing section 304, each thermal processing unit PHP provided to be adjacent to the cleaning drying processing block 14A is configured to be capable of carrying in the substrate W from the cleaning drying processing block 14A.

A plurality (five in the present example) of cleaning drying processing units SD2 are provided in the cleaning drying processing section 162. In each cleaning drying processing unit SD2, the cleaning and drying processing for the substrate W after the exposure processing is performed.

(4) Configuration of Transport Sections

Figure 4:
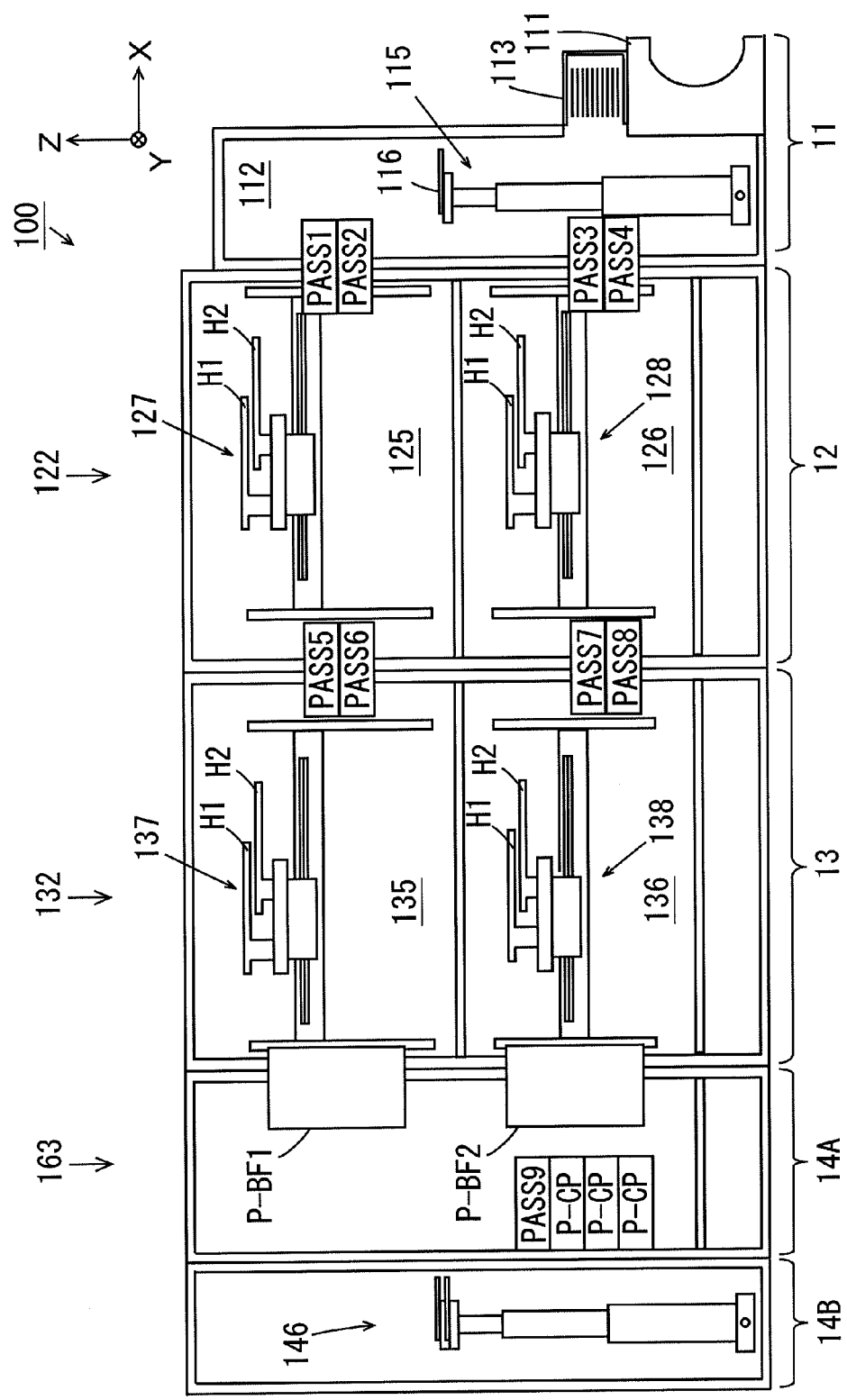
FIG. 4 is a side view mainly showing transport sections of FIG. 1.

FIG. 4 is a side view mainly showing the transport sections 122, 132, 163 of FIG. 1. As shown in FIG. 4, the transport section 122 has an upper transport chamber 125 and a lower transport chamber 126. The transport section 132 has an upper transport chamber 135 and a lower transport chamber 136. The transport mechanism 127 is provided in the upper transport chamber 125, and the transport mechanism 128 is provided in the lower transport chamber 126. Further, the transport mechanism 137 is provided in the upper transport chamber 135, and the transport mechanism 138 is provided in the lower transport chamber 136.

The substrate platforms PASS1, PASS2 are provided between the transport section 112 and the upper transport chamber 125, and the substrate platforms PASS3, PASS4 are provided between the transport section 112 and the lower transport chamber 126. The substrate platforms PASS5, PASS6 are provided between the upper transport chamber 125 and the upper transport chamber 135, and the substrate platforms PASS7, PASS8 are provided between the lower transport chamber 126 and the lower transport chamber 136.

The placement buffer unit P-BF1 is provided between the upper transport chamber 135 and the transport section 163, and the placement buffer unit P-BF2 is provided between the lower transport chamber 136 and the transport section 163. The substrate platform PASS9 and the plurality of placement cooling platforms P-CP are provided to be adjacent to the interface block 14 in the transport section 163.

The transport mechanism 127 is configured to be capable of transporting the substrate W among the substrate platforms PASS1, PASS2, PASS5, PASS6, the coating processing chambers 21, 22 (FIG. 2) and the upper thermal processing section 301 (FIG. 3). The transport mechanism 128 is configured to be capable of transporting the substrate W among the substrate platforms PASS3, PASS4, PASS7, PASS8, the coating processing chambers 23, 24 (FIG. 2) and the lower thermal processing section 302 (FIG. 3).

The transport mechanism 137 is configured to be capable of transporting the substrate W among the substrate platforms PASS5, PASS6, the placement buffer unit P-BF1, the development processing chambers 31, 32 (FIG. 2) and the upper thermal processing section 303 (FIG. 3). The transport mechanism 138 is configured to be capable of transporting the substrate W among the substrate platforms PASS7, PASS8, the placement buffer unit P-BF2, the development processing chambers 33, 34 (FIG. 2) and the lower thermal processing section 304 (FIG. 3).

Each of the transport mechanisms 127, 128, 137, 138 has hands H1, H2 each transporting the substrate W while sucking the back surface of the substrate W and holding the substrate W. Thus, during transportation of the substrate W, deviation of the position of the substrate W and a change in position of the notch with respect to the center of the substrate W on the hand H1, H2 is prevented.

(5) Operation of Substrate Processing Apparatus

The operation of the substrate processing apparatus 100 will be described with reference to FIGS. 1 to 4. The carrier 113 in which the unprocessed substrates W are stored is placed on the carrier platform 111 (FIG. 1) in the indexer block 11. The transport mechanism 115 transports the unprocessed substrate W from the carrier 113 to the substrate platform PASS1, PASS3 (FIG. 4). Further, the transport mechanism 115 transports the processed substrate W that is placed on the substrate platform PASS2, PASS4 (FIG. 4) to the carrier 113.

In the first processing block 12, the transport mechanism 127 (FIG. 4) sequentially transports the substrate W placed on the substrate platform PASS1 to the adhesion reinforcement processing unit PAHP (FIG. 3), the cooling unit CP (FIG. 3) and the aligner AL (FIG. 3). Next, the transport mechanism 127 sequentially transports the substrate W aligned by the aligner AL to the coating processing chamber 22 (FIG. 2), the thermal processing unit PHP (FIG. 3), the cooling unit CP (FIG. 3) and the aligner AL (FIG. 3). Subsequently, the transport mechanism 127 sequentially transports the substrate W aligned by the aligner AL again to the coating processing chamber 21 (FIG. 2), the thermal processing unit PHP (FIG. 3) and the substrate platform PASS5 (FIG. 4).

In this case, after the adhesion reinforcement processing is performed on the substrate W in the adhesion reinforcement processing unit PAHP, the substrate W is cooled to a temperature suitable for formation of the anti-reflection film in the cooling unit CP. Next, the anti-reflection film is formed on the substrate W by the coating processing unit 129 (FIG. 2) in the coating processing chamber 22 after the alignment for the substrate W is performed. Subsequently, after the thermal processing for the substrate W is performed in the thermal processing unit PHP, the substrate W is cooled to a temperature suitable for the formation of the resist film in the cooling unit CP. Next, the resist film is formed on the substrate W by the coating processing unit 129 (FIG. 2) in the coating processing chamber 21 after the alignment for the substrate W is performed again in the aligner AL. Thereafter, the thermal processing for the substrate W is performed in the thermal processing unit PHP, and the substrate W is placed on the substrate platform PASS5.

Further, the transport mechanism 127 transports the substrate W after the development processing that is placed on the substrate platform PASS6 (FIG. 4) to the substrate platform PASS2 (FIG. 4).

The transport mechanism 128 (FIG. 4) sequentially transports the substrate W placed on the substrate platform PASS3 to the adhesion reinforcement processing unit PAHP (FIG. 3), the cooling unit CP (FIG. 3) and the aligner AL (FIG. 3). Then, the transport mechanism 128 sequentially transports the substrate W aligned by the aligner AL to the coating processing chamber 24 (FIG. 2), the thermal processing unit PHP (FIG. 3), the cooling unit CP (FIG. 3) and the aligner AL (FIG. 3). Next, the transport mechanism 128 sequentially transports the substrate W aligned by the aligner AL again to the coating processing chamber 23 (FIG. 2), the thermal processing unit PHP (FIG. 3) and the substrate platform PASS7 (FIG. 4).

Further, the transport mechanism 128 (FIG. 4) transports the substrate W after the development processing that is placed on the substrate platform PASS8 (FIG. 4) to the substrate platform PASS4 (FIG. 4). The processing contents for the substrate W in the coating processing chambers 23, 24 (FIG. 2) and the lower thermal processing section 302 (FIG. 3) are similar to the processing contents for the substrate W in the above-mentioned coating processing chambers 21, 22 (FIG. 2) and the upper thermal processing section 301 (FIG. 3).

In the second processing block 13, the transport mechanism 137 (FIG. 4) transports the substrate W after the resist film formation that is placed on the substrate platform PASS5 (FIG. 4) to the aligner AL (FIG. 3). Subsequently, the transport mechanism 137 sequentially transports the substrate W aligned by the aligner AL to the edge exposure unit EEW (FIG. 3) and the placement buffer unit P-BF1 (FIG. 4). In this case, after the alignment for the substrate W is performed in the aligner AL, the edge exposure processing is performed on the substrate W in the edge exposure unit EEW. The substrate W after the edge exposure processing is placed on the placement buffer unit P-BF1.

Further, the transport mechanism 137 (FIG. 4) takes out the substrate W after the exposure processing and the thermal processing from the thermal processing unit PHP (FIG. 3) that is adjacent to the cleaning drying processing block 14A. The transport mechanism 137 sequentially transports the substrate W to the cooling unit CP (FIG. 3), any one of the development processing chambers 31, 32 (FIG. 2), the thermal processing unit PHP (FIG. 3) and the substrate platform PASS6 (FIG. 4).

In this case, the development processing for the substrate W is performed by the development processing unit 139 in any one of the development processing chambers 31, 32 after the substrate W is cooled to a temperature suitable for the development processing in the cooling unit CP. Thereafter, the thermal processing for the substrate W is performed in the thermal processing unit PHP, and the substrate W is placed on the substrate platform PASS6.

The transport mechanism 138 (FIG. 4) transports the substrate W after the resist film formation that is placed on the substrate platform PASS7 to the aligner AL (FIG. 3). Then, the transport mechanism 138 sequentially transports the substrate W aligned by the aligner AL to the edge exposure unit EEW (FIG. 3) and the placement buffer unit P-BF2 (FIG. 4).

Further, the transport mechanism 138 (FIG. 4) takes out the substrate W after the exposure processing and the thermal processing from the thermal processing unit PHP (FIG. 3) that is adjacent to the cleaning drying processing block 14. The transport mechanism 138 sequentially transports the substrate W to the cooling unit CP (FIG. 3), any one of the development processing chambers 33, 34 (FIG. 2), the thermal processing unit PHP (FIG. 3) and the substrate platform PASS8 (FIG. 4). The processing contents for the substrate W in the development processing chambers 33, 34 and the lower thermal processing section 304 are similar to the processing contents for the substrate W in the above-mentioned development processing chambers 31, 32 and upper thermal processing section 303.

In the cleaning drying processing block 14A, the transport mechanism 141 (FIG. 1) transports the substrate W that is placed on the placement buffer unit P-BF1, P-BF2 (FIG. 4) to the cleaning drying processing unit SD1 (FIG. 2) in the cleaning drying processing section 161. Subsequently, the transport mechanism 41 transports the substrate W from the cleaning drying processing unit SD1 to the placement cooling unit P-CP (FIG. 4). In this case, the substrate W is cooled in the placement cooling platform P-CP to a temperature suitable for the exposure processing in the exposure device 15 (FIG. 1) after the cleaning and drying processing for the substrate W are performed in the cleaning drying processing unit SD1.

The transport mechanism 142 (FIG. 1) transports the substrate W after the exposure processing that is placed on the substrate platform PASS9 (FIG. 4) to the cleaning drying processing unit SD2 (FIG. 3) in the cleaning drying processing section 162. Further, the transport mechanism 142 transports the substrate W after the cleaning and drying processing to the thermal processing unit PHP (FIG. 3) in the upper thermal processing section 303 or the thermal processing unit PHP (FIG. 3) in the lower thermal processing section 304 from the cleaning drying processing unit SD2. In this thermal processing unit PHP, post-exposure bake (PEB) processing is performed.

In the interface block 14, the transport mechanism 146 (FIG. 1) transports the substrate W before the exposure processing that is placed on the placement cooling platform P-CP (FIG. 4) to the substrate inlet 15a (FIG. 1) of the exposure device 15. Further, the transport mechanism 146 (FIG. 1) takes out the substrate W after the exposure processing from the substrate outlet 15b (FIG. 1) of the exposure device 15 and transports the substrate W to the substrate platform PASS9 (FIG. 4).

When the exposure device 15 cannot receive the substrate W, the substrate W before the exposure processing is temporarily stored in the placement buffer unit P-BF1, P-BF2. Further, when the development processing unit 139 (FIG. 2) in the second processing block 13 cannot receive the substrate W after the exposure processing, the substrate W after the exposure processing is temporarily stored in the placement buffer unit P-BF1, P-BF2.

In the present embodiment, the processing for the substrate W in the coating processing chambers 21, 22, the development processing chambers 31, 32 and the upper thermal processing sections 301, 303 that are provided above, and the processing for the substrate W in the coating processing chambers 23, 24, the development processing chambers 33, 34 and the lower thermal processing sections 302, 304 that are provided below can be concurrently performed. Thus, it is possible to improve throughput without increasing a footprint.

(6) Aligners

Figure 5:
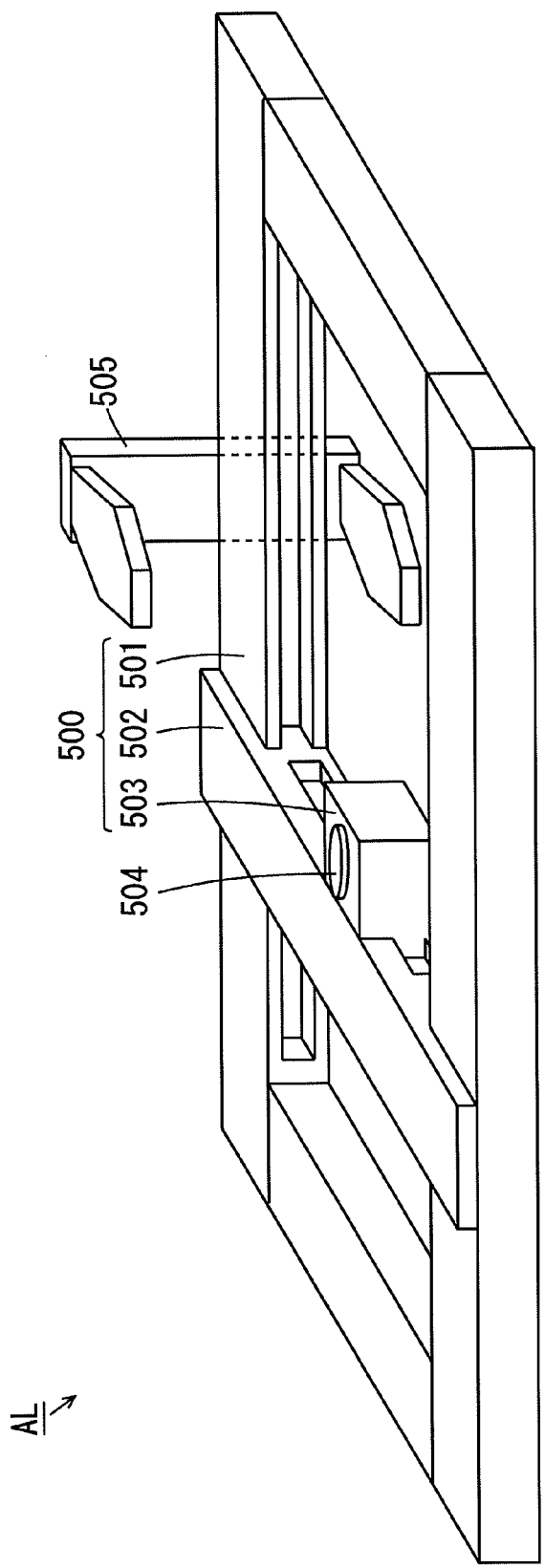
FIG. 5 is a schematic perspective view for explaining a configuration of an aligner.
Figure 6:
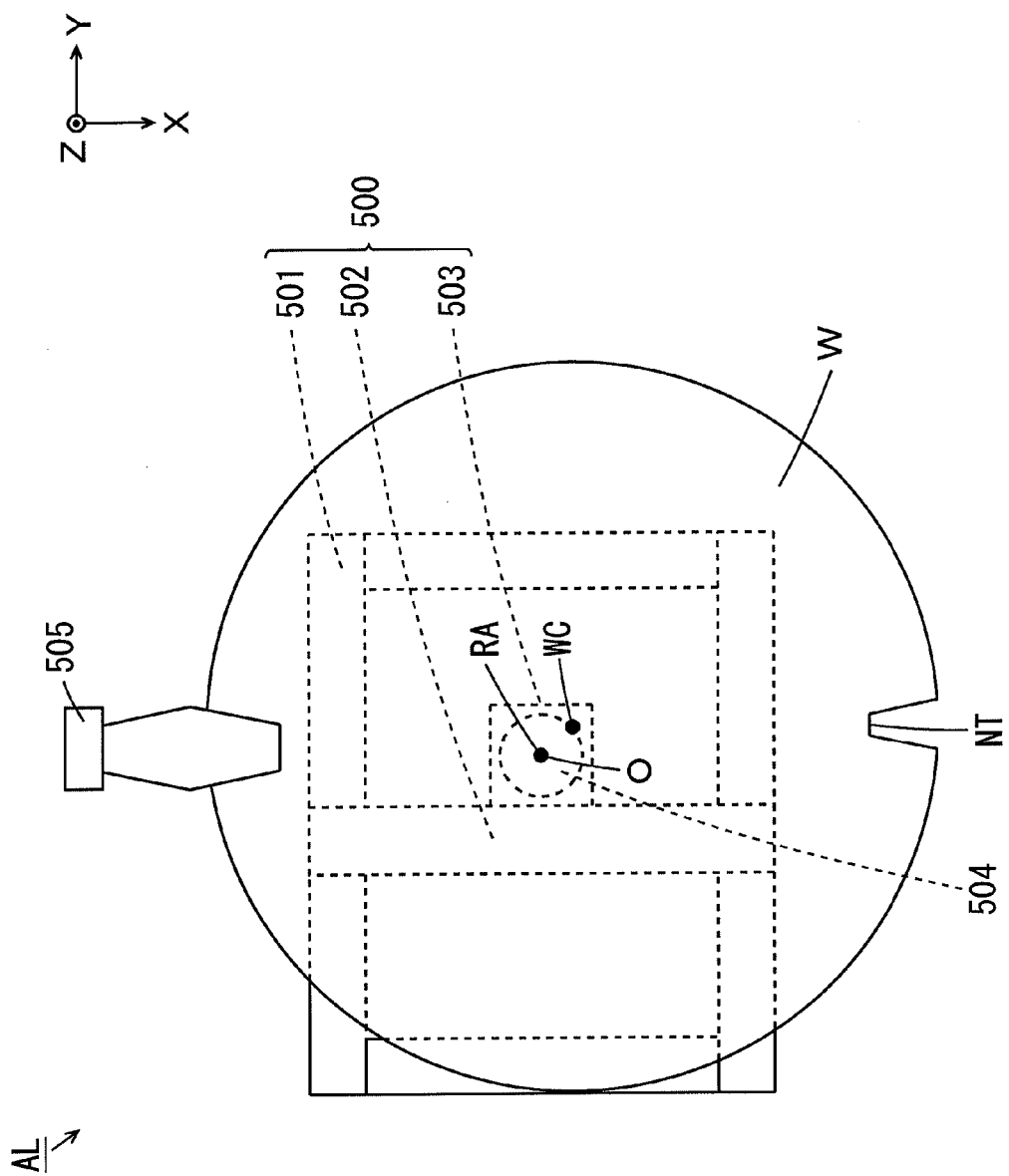
FIG. 6 is a plan view of the aligner of FIG. 5 with a substrate being held.

FIG. 5 is a schematic perspective view for explaining a configuration of the aligner AL. FIG. 6 is a plan view of the aligner AL of FIG. 5 with the substrate W being held. As shown in FIGS. 5 and 6, the aligner AL includes a moving device 500, a rotation holding device 504 and a line sensor 505. The moving device 500 includes a support member 501, a Y direction movable portion 502 and an X direction movable portion 503.

The Y direction movable portion 502 is configured to be movable in the Y direction with respect to the support member 501. The X direction movable portion 503 is configured to be movable in the X direction with respect to the Y direction movable portion 502. The rotation holding device 504 is fixed to the X direction movable portion 503. The rotation holding device 504 is made of a suction-type spin chuck, for example, and sucks the back surface of the substrate W and holds the substrate W. This rotation holding device 504 is driven to be rotated about a rotation axis RA in the vertical direction by a motor (not shown) provided at the X direction movable portion 503. Thus, the substrate W is rotated about the rotation axis RA.

An origin position O is set in advance in the aligner AL. Here, coordinates of the origin position O are (0, 0). In an initial state, the Y direction movable portion 502 and the X direction movable portion 503 are positioned such that the rotation axis RA of the rotation holding device 504 coincides with the origin position O.

A CCD (a charge-coupled device) line sensor is used as the line sensor 505, for example. The line sensor 505 is used to measure a position of the outer periphery of the substrate W in the X direction. The line sensor 505 is arranged to extend in the X direction.

Figure 7:
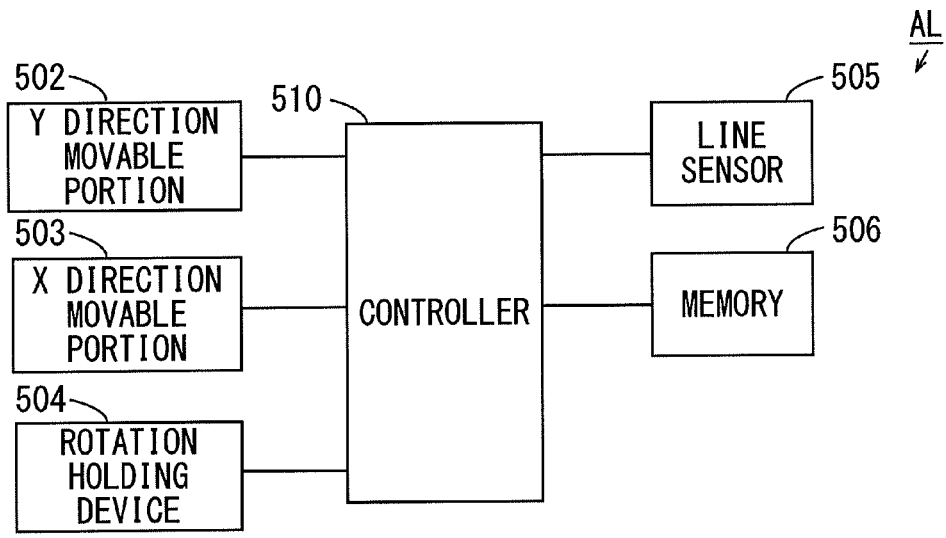
FIG. 7 is a block diagram showing a configuration of a control system of the aligner.

FIG. 7 is a block diagram showing a configuration of a control system of the aligner AL. As shown in FIG. 7, the aligner AL further includes a memory 506 and a controller 510. Correction information for performing the alignment for the substrate W, described below, is stored in the memory 506. The controller 510 is constituted by a CPU (Central Processing Unit). The controller 510 may be realized by the controller 114 of FIG. 1.

The controller 510 controls the Y direction movable portion 502 and the X direction movable portion 503 of the moving device 500 and the rotation holding device 504 based on output signals of the line sensor 505. Further, the controller 510 controls the Y direction movable portion 502 and the X direction movable portion 503 of the moving device 500 and the rotation holding device 504 based on the correction information stored in the memory 506.

A direction of a straight line that connects a center WC and the notch NT of the substrate W is referred to as a direction of the notch NT. In the present embodiment, the X direction is a reference direction. An angle, which the direction of the notch NT forms with the reference direction (the X direction) is referred to as a rotation direction offset amount θoff. In the example of FIG. 6, the direction of the notch NT coincides with the reference direction. That is, the rotation direction offset amount θoff is 0°.

Further, an amount of deviation from the rotation axis RA to the center WC of the substrate W in the X direction is referred to as an X offset amount Xoff, and an amount of deviation from the rotation axis RA to the center WC of the substrate W in the Y direction is referred to as a Y offset amount Yoff. In the example of FIG. 6, the center WC of the substrate W does not coincide with the rotation axis RA of the rotation holding device 504. That is, the center WC of the substrate W deviates from the rotation axis RA.

The rotation holding device 504 is rotated by 360° about the rotation axis RA. Thus, the substrate W held by the rotation holding device 504 is rotated by 360°. During the rotation of the substrate W, the controller 510 of FIG. 7 acquires the output signal of the line sensor 505 as position data. The position data indicates the position of the outer periphery of the substrate W in the X direction that is detected by the line sensor 505.

Figure 8:
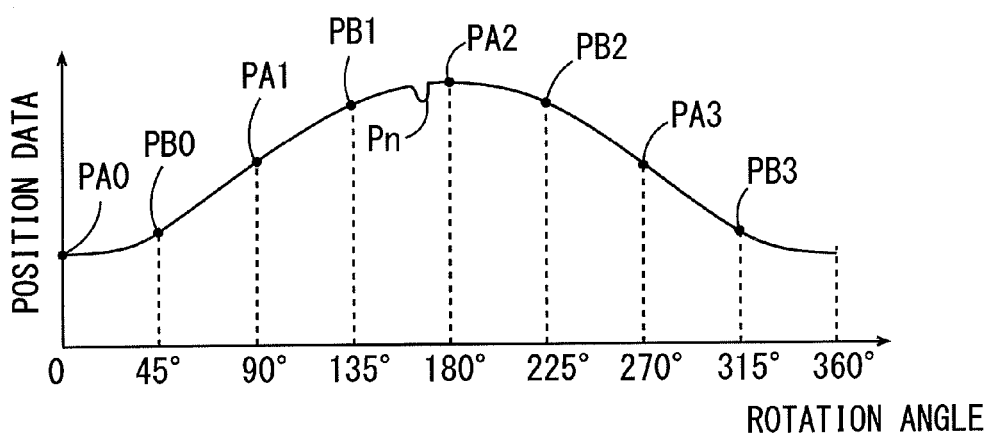
FIG. 8 is a diagram showing one example of position data acquired based on output signals of a line sensor.

Here, a method of calculation of the position of the center WC and the notch NT of the substrate W will be described with reference to FIG. 8. FIG. 8 is a diagram showing one example of the position data acquired based on the output signals of the line sensor 505. In FIG. 8, the ordinate indicates the position data, and the abscissa indicates the rotation angle of the substrate W.

When the center WC of the substrate W deviates from the rotation axis RA, a value of the position data changes as the substrate W is rotated as shown in FIG. 8. The controller 510 acquires the position data for every rotation of the substrate W by 0.1°, for example. In this case, 3600 of the position data are acquired. The controller 510 detects position data Pn corresponding to the notch NT based on a change in position data and calculates the rotation direction offset amount θoff of the notch NT based on the rotation angle corresponding to the position data Pn.

Further, the controller 510 calculates the X offset amount Xoff and the Y offset amount Yoff of the center WC of the substrate W with respect to the rotation axis RA based on a change in position data.

Letting the position data when the rotation angles of the substrate W are 0°, 90°, 180° and 270° be respective PA0, PA1, PA2 and PA3. In this case, the X offset amount Xoff and the Y offset amount Yoff are calculated in the following formula.

$$Xoff=(PA0-PA2)/2 \tag{1}$$

$$Yoff=(PA1-PA3)/2 \tag{2}$$

Further, letting the position data when the rotation angles of the substrate W are 45°, 135°, 225° and 315° be respective PB0, PB1, PB2 and PB3. In this case, the X offset amount Xoff and the Y offset amount Yoff are calculated in the following formula.

$$Xoff=(PB1-PB3)/2 \times \sin 45° - (PB0-PB2)/2 \times \cos 45° \tag{3}$$

$$Yoff=(PB1-PB3)/2 \times \cos 45° - (PB0-PB2)/2 \times \sin 45° \tag{4}$$

When the notch NT is at any one of the rotation angles 45°, 135°, 225° and 315° or a position in the vicinity of them, the X offset amount Xoff and the Y offset amount Yoff are calculated using the above formulas (1), (2). Further, when the notch NT is at any one of the rotation angles 0°, 90°, 180°, 270° or a position in the vicinity of them, the X offset amount Xoff and the Y offset amount Yoff are calculated using the above formulas (3), (4).

(7) Acquisition of Correction Information

In the present embodiment, the transport mechanism 127, 128, 137, 138 of FIG. 4 performs the transportation of the substrate W according to a predetermined transport path during installation or maintenance of the substrate processing apparatus 100. The teaching for correcting deviation between a position at which the substrate W is to be supported and a position at which the substrate W is actually supported is not performed on the transport mechanism 127, 128, 137, 138. Here, in the present embodiment, the position at which the substrate W is to be supported is the spin chuck 25 of FIG. 2 and a spin chuck (not shown) of the edge exposure unit EEW of FIG. 3.

Therefore, when the substrate W is transported to the spin chuck 25 by the transport mechanism 127, 128, the substrate W is sometimes held by the spin chuck 25 with a rotational center of the spin chuck 25 being deviating from the center WC of the substrate W. Similarly, when the substrate W is transported to the edge exposure unit EEW by the transport mechanism 137, 138, the substrate W is sometimes held by the spin chuck with a rotational center of the spin chuck of the edge exposure unit EEW being deviating from the center WC of the substrate W.

In the present embodiment, the alignment for the substrate W is performed in advance by the aligner AL such that, when the substrate W is transported to the spin chuck 25, the rotational center of the spin chuck 25 coincides with the center WC of the substrate W. The rotational center of the spin chuck 25 is equivalent to a reference position. Similarly, the alignment for the substrate W is performed in advance by the aligner AL such that, when the substrate W is transported to the edge exposure unit EEW, the rotational center of the spin chuck of the edge exposure unit EEW coincides with the center WC of the substrate W.

Figure 9:
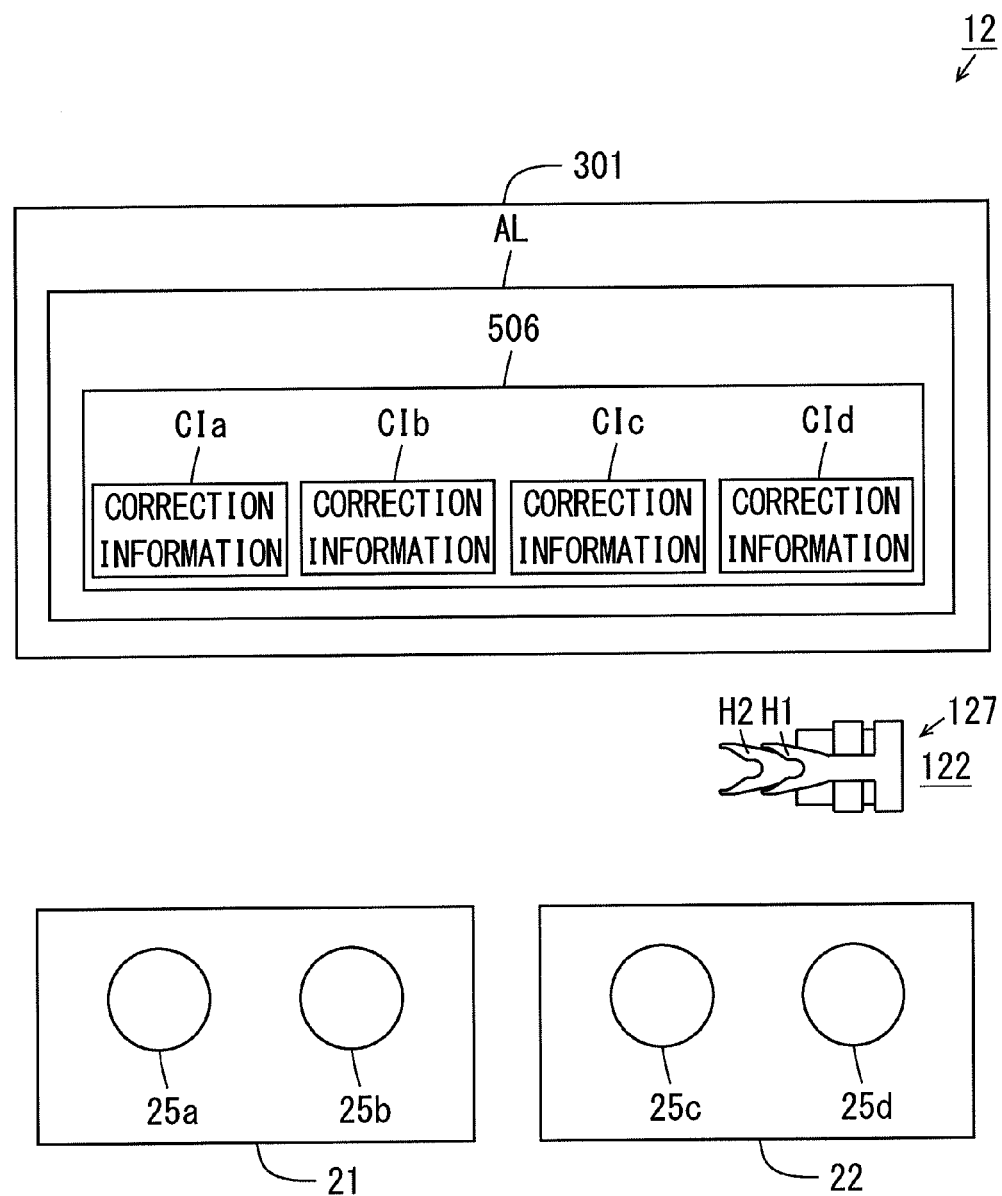
FIG. 9 is a block diagram showing a relationship between the aligner and a plurality of spin chucks.

Regarding the aligner AL provided in the upper thermal processing section 301 (FIG. 3) of the first processing block 12, steps of acquiring the correction information for performing the alignment will be described below. FIG. 9 is a block diagram showing a relationship between the aligner AL and the plurality of spin chucks 25. In FIG. 9, two spin chucks 25 in the coating processing chamber 21 are referred to as the spin chucks 25a, 25b, respectively, and two spin chucks 25 in the coating processing chamber 22 are referred to as the spin chucks 25c, 25d, respectively.

As shown in FIG. 9, the correction information CIa, CIb, CIc, CId are stored in the memory 506 of the aligner AL provided in the upper thermal processing section 301. The correction information CIa to CId are correction information for performing the alignment such that the rotational centers of the spin chucks 25a to 25d respectively coincide with the centers WC of the substrates W. The correction information CIa to CId are acquired during the installation or maintenance of the substrate processing apparatus 100 and are stored in the memory 506. The steps of acquiring the correction information CIa will be described below.

FIGS. 10 to 13 are diagrams for explaining the steps of acquiring the correction information CIa. In the description of the FIGS. 10 to 13, a direction in which an arrow X is directed is referred to as a +X direction, and a direction that is opposite to the arrow X is referred to as a −X direction. Further, a direction in which an arrow Y is directed is referred to as a +Y direction, and a direction opposite to the arrow Y is referred as a −Y direction.

Figure 10:
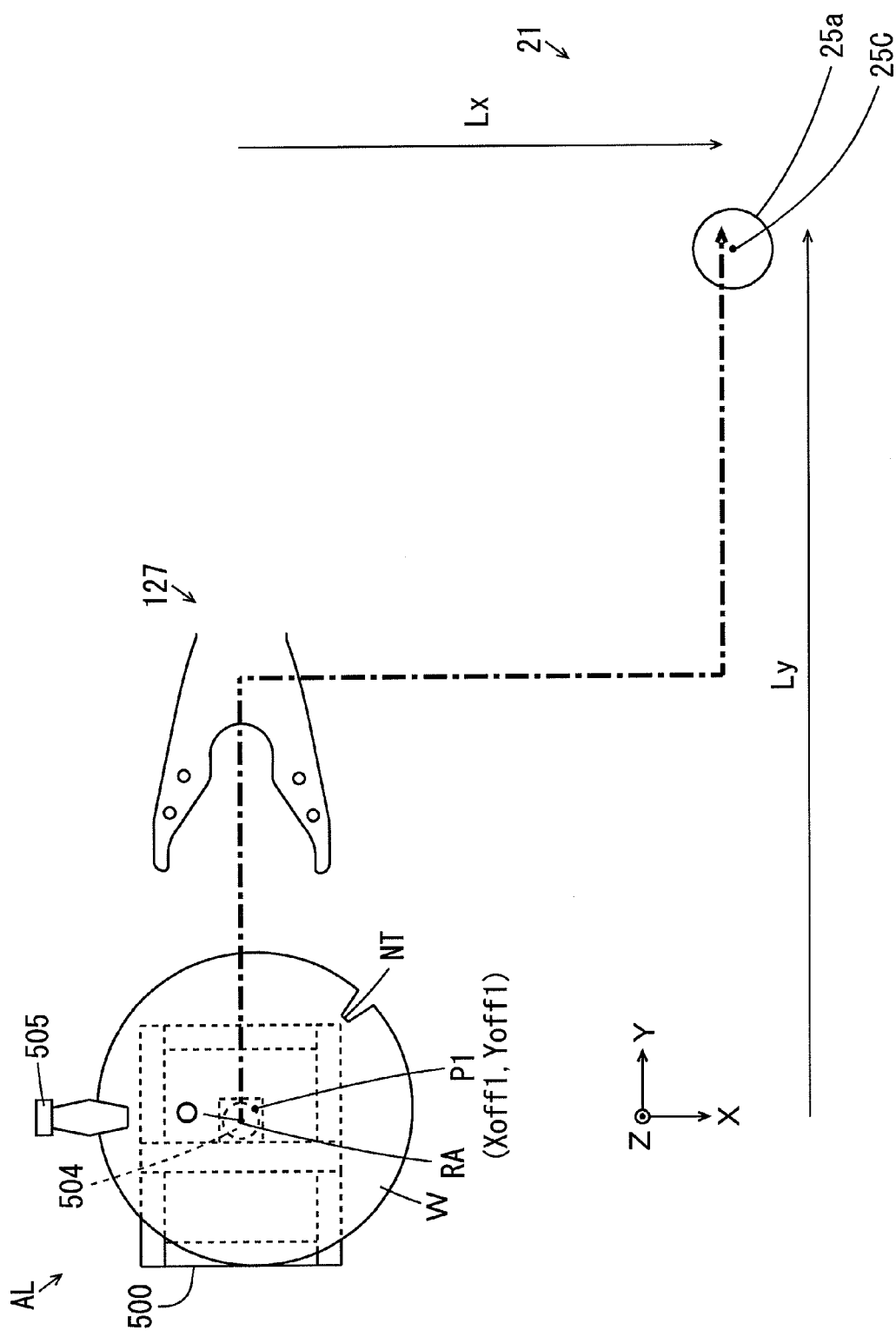
FIG. 10 is a diagram for explaining steps of acquiring correction information.

First, as shown in FIG. 10, with the rotation axis RA of the rotation holding device 504 coinciding with the origin position O, the substrate W is carried in the aligner AL and held by the rotation holding device 504. A position of the center WC of the substrate W at this time is P1.

Here, the X offset amount Xoff and the Y offset amount Yoff of the substrate W are calculated. The calculated X offset amount Xoff and Y offset amount Yoff are Xoff1 and Yoff1, respectively. Therefore, coordinates of the position P1 are (Xoff1, Yoff1).

Next, as indicated by a one-dotted dashed arrow in FIG. 10, the substrate W is moved by a distance Lx in the +X direction and is moved by a distance Ly in the +Y direction by the transport mechanism 127. Thus, as shown in FIG. 11, the substrate W is transported from the aligner AL to the spin chuck 25a. At this time point, a rotational center 25C of the spin chuck 25a does not coincide with the center WC of the substrate W.

Subsequently, as indicated by a one-dotted and dashed arrow in FIG. 11, the substrate W is rotated by a predetermined angle by the spin chuck 25a. The rotation angle of the substrate W is preferably 180°. In this case, the rotational center 25C of the spin chuck 25a is a middle point between the center WC of the substrate W of FIG. 11 before the rotation and the center WC of the substrate W of FIG. 12 after the rotation.

Figure 12:
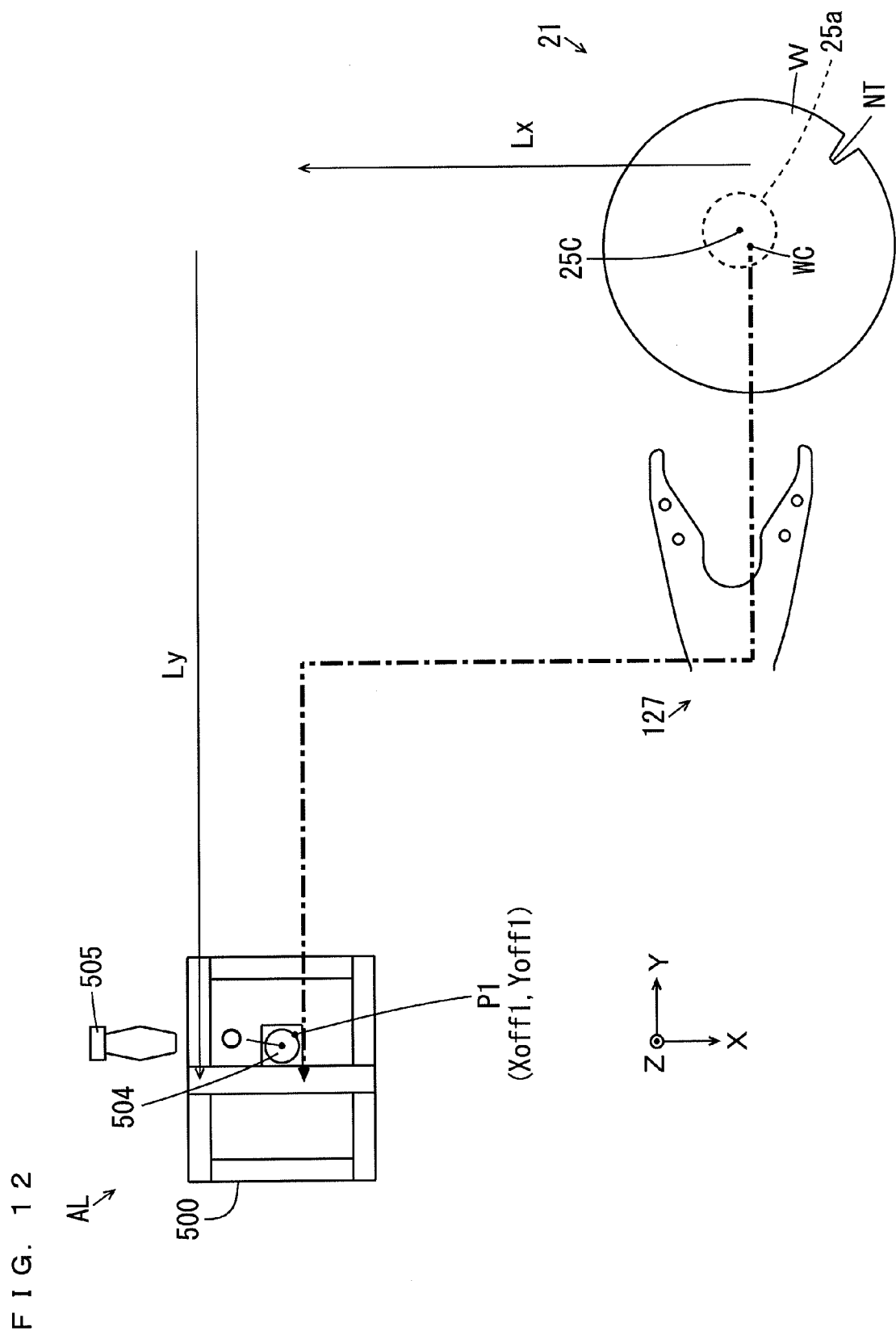
FIG. 12 is a diagram for explaining the steps of acquiring the correction information.

Thereafter, as indicated by a one-dotted and dashed arrow in FIG. 12, the substrate W is moved by the distance Lx in the −X direction and is moved by the distance Ly in the −Y direction by the transport mechanism 127. Thus, as shown in FIG. 13, the substrate W is transported from the spin chuck 25a to the aligner AL. A position of the center WC of the substrate W at this time is P2.

Here, the X offset amount Xoff and the Y offset amount Yoff of the substrate W are calculated. The calculated X offset amount Xoff and Y offset amount Yoff are Xoff2 and Yoff2, respectively. Therefore, coordinates of the position P2 are (Xoff2, Xoff2).

Next, a correction position P0 is calculated based on the calculated X offset amounts Xoff1, Xoff2 and Y offset amounts Yoff1, Yoff2. The correction position P0 is a position at which the center WC of the substrate W is to be in the aligner AL when the substrate W is transported from the aligner AL to the spin chuck 25a in order for the center WC of the substrate W to coincide with the rotational center 25C of the spin chuck 25 in the spin chuck 25a. That is, with the center WC of the substrate W coinciding with the correction position P0 in the aligner AL, when the substrate W is transported from the aligner AL to the spin chuck 25a, the center WC of the substrate W coincides with the rotational center 25C of the spin chuck 25a. In the example of FIG. 13, the correction position P0 is a middle point between the positions P1, P2. An X coordinate of the correction position P0 is (Xoff1+Xoff2)/2, and a Y coordinate of the correction position P0 is (Yoff1+Yoff2)/2.

The correction positions P0 corresponding to the respective spin chucks 25b to 25d of FIG. 9 are calculated by the steps as described above. The correction positions P0 corresponding to the respective spin chucks 25a to 25d are stored in the memory 506 of FIG. 9 as the correction information CIa to CId, respectively. Further, the correction information CIa to CId may include constant values of the rotation direction offset amounts θoff corresponding to the spin chucks 25a to 25d as correction directions.

(8) Alignment for Substrate

Figure 14:
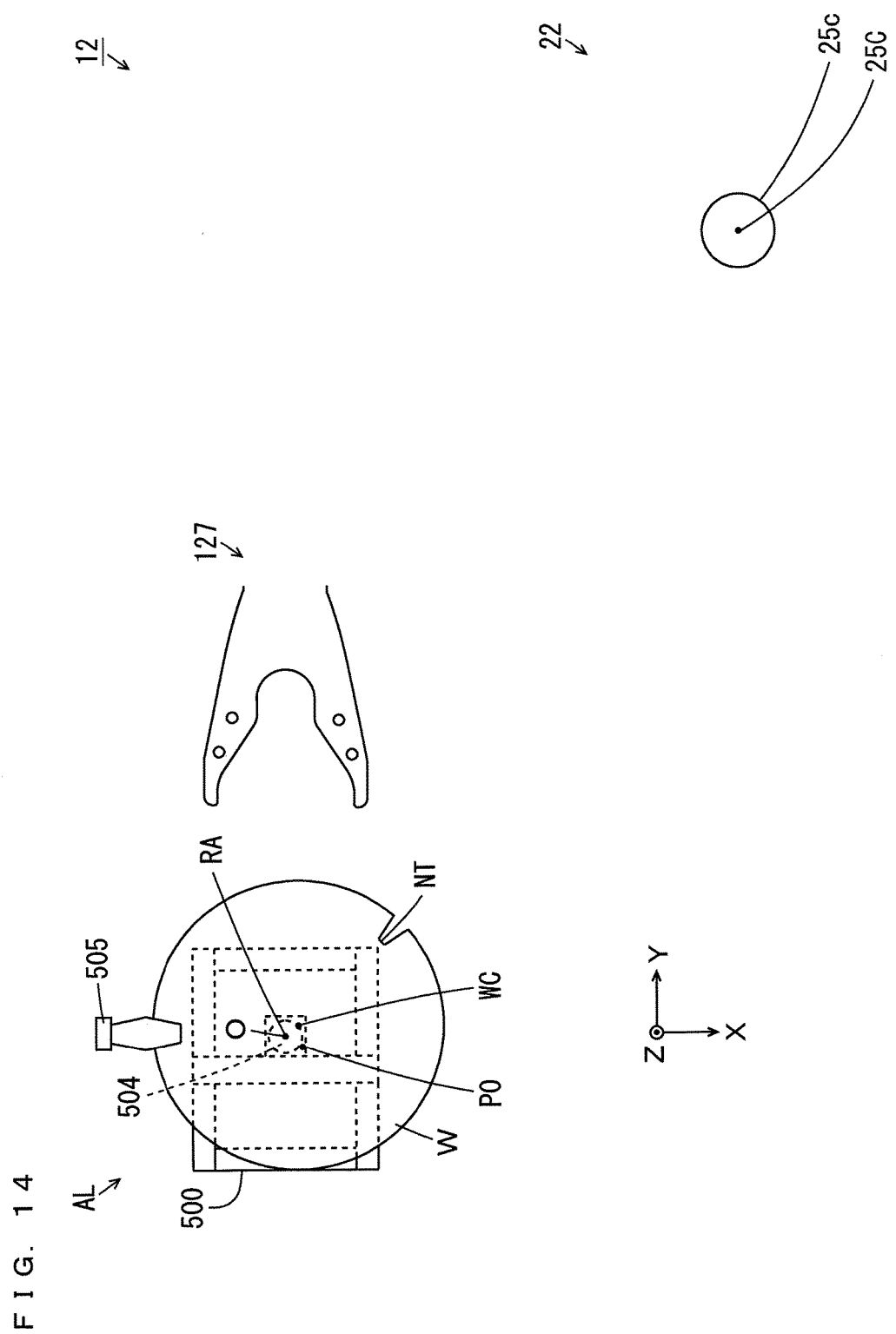
FIG. 14 is a diagram for explaining alignment for the substrate in substrate processing in a first processing block.
Figure 15:
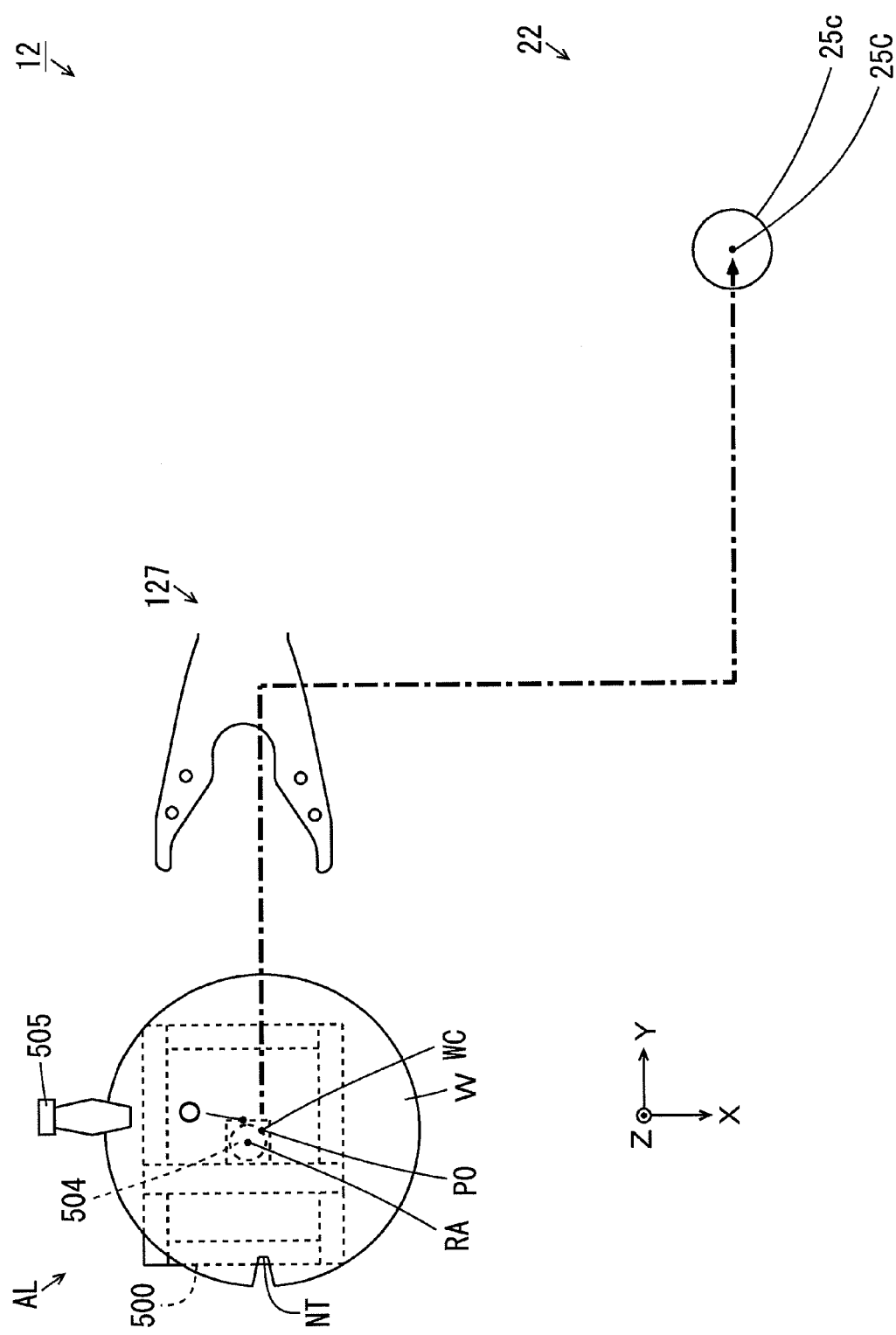
FIG. 15 is a diagram for explaining the alignment for the substrate in the substrate processing in the first processing block.

Next, the alignment for the substrate W by the aligner AL during the processing for the substrate W will be described. FIGS. 14 to 16 are diagrams for explaining the alignment for the substrate W in the substrate processing by the first processing block 12.

In the first processing block 12, the transport mechanism 127 sequentially transports the substrate W placed on the substrate platform PASS1 of FIG. 4 to the adhesion reinforcement processing unit PAHP (FIG. 3), the cooling unit CP (FIG. 3) and the aligner AL (FIG. 3). At this time, the rotation axis RA of the rotation holding device 504 coincides with the origin position O. In this state, as shown in FIG. 14, the substrate W on which the adhesion reinforcement processing and the cooling processing are performed is held by the rotation holding device 504. Here, the X offset amount Xoff, the Y offset amount Yoff and the rotation direction offset amount θoff of the substrate W are calculated. Thus, a direction of the center WC and the notch NT of the substrate W are detected.

Next, the alignment for the substrate W is performed by the aligner AL as shown in FIG. 15 based on the correction information stored in the memory 506 of FIG. 9. In the alignment, the substrate W is rotated by the rotation holding device 504 such that the rotation direction offset amount θoff is the constant value. In the example of FIG. 15, the rotation direction offset amount θoff is 90°. Here, the constant value of the rotation direction offset amount θoff is included in the correction information CIc as the correction direction. Further, the correction position P0 is acquired based on the correction information CIc stored in the memory 506. The substrate W is moved in the X and Y directions by the moving device 500 such that the center WC of the rotated substrate W coincides with the acquired correction position P0.

Next, as indicated by a one-dotted dashed arrow in FIG. 15, the substrate W is moved by a predetermined constant distance in the +X direction and is moved by a predetermined constant distance in the +Y direction by the transport mechanism 127. Thus, as shown in FIG. 16, the substrate W is held by the spin chuck 25c with the direction of the notch NT being constant and the rotational center 25C of the spin chuck 25c coinciding with the center WC of the substrate W. In this state, in the coating processing chamber 22, the anti-reflection film is formed on the substrate W by the coating processing unit 129 (FIG. 2).

Thereafter, the transport mechanism 127 sequentially transports the substrate W on which the anti-reflection film is formed in the coating processing chamber 22 to the thermal processing unit PHP (FIG. 3), the cooling unit CP (FIG. 3) and the aligner AL. At this time, the rotation axis RA of the rotation holding device 504 coincides with the origin position O. In this state, the substrate W on which the thermal processing and the cooling processing are performed is held by the rotation holding device 504 as described above. Here, the direction of the center WC and the notch NT of the substrate W are detected.

Next, in the aligner AL, the substrate W is rotated by the rotation holding device 504 such that the rotation direction offset amount θoff is the constant value. Here, the constant value of the rotation direction offset amount θoff is included in the correction information CIa as the correction direction. Further, the correction position P0 is acquired based on the correction information CIa stored in the memory 506 of FIG. 9. The substrate W is moved in the X and Y directions by the moving device 500 such that the center WC of the rotated substrate W coincides with the acquired correction position P0.

Subsequently, the substrate W is moved by a predetermined constant distance in the +X direction and is moved by a predetermined constant distance in the +Y direction by the transport mechanism 127. Thus, the substrate W is held by the spin chuck 25a with the direction of the notch NT being constant and the rotational center 25C of the spin chuck 25a of FIG. 10 coinciding with the center WC of the substrate W. In this state, the resist film is formed on the substrate W by the coating processing unit 129 (FIG. 2) in the coating processing chamber 21 (FIG. 2).

Thereafter, the substrate W on which the resist film is formed in the coating processing chamber 21 is sequentially transported to the thermal processing unit PHP (FIG. 3) and the substrate platform PASS5 (FIG. 4). Thus, the substrate W on which the thermal processing is performed is placed on the substrate platform PASS5.

In the transportation of the above-mentioned substrate W, the alignment for the substrate W is performed by the aligner AL based on the correction information corresponding to the position at which the substrate W is to be supported. Specifically, the alignment for the substrate W for coincidence of the rotational center 25C of the spin chuck 25c with the center WC of the substrate W is performed based on the correction information CIc. Further, the alignment for the substrate W for coincidence of the rotational center 25C of the spin chuck 25a with the center WC of the substrate W is performed based on the correction information CIa.

Therefore, the rotational center 25C of the spin chuck 25c can coincide with the center WC of the substrate W in the coating processing chamber 22, and the rotational center 25C of the spin chuck 25a can coincide with the center WC of the substrate W in the coating processing chamber 21. Thus, accuracy of formation of the anti-reflection film of the substrate W and accuracy of formation of the resist film of the substrate W can be improved. Further, because the processing is performed on the substrates W with the directions of the notches NT being constant, the accuracy of the formation of the anti-reflection films and the accuracy of the formation of the resist films of the plurality of substrates W can be uniform.

(9) Effects

In the present embodiment, the plurality of correction information CIa to CId respectively corresponding to the plurality of spin chucks 25a to 25d are acquired in advance during the acquisition of the correction information and are stored in the memory 506. During the processing for the substrate W, the position of the substrate W is adjusted by the aligner AL before the substrate W is transported from the aligner AL to any one of the spin chucks 25a to 25d during the processing for the substrate W based on the correction information corresponding to the spin chuck 25 stored in the memory 506. The substrate W of which the position is adjusted by the aligner AL is transported to the spin chuck 25 by the transport mechanism 127.

This configuration causes the plurality of correction information CIa to CId for adjusting the position of the substrate W by the aligner AL to be acquired in advance and to be stored in the memory 506. Therefore, the alignment for the coincidence of the center WC of the substrate W with the rotational center 25C of each spin chuck 25a to 25d is performed by the aligner AL before the transportation of the substrate W. Further, the alignment for the coincidence of the direction of the notch NT of the substrate W with the constant direction is performed by the aligner AL before the transportation of the substrate W.

Thus, during the processing for the substrate W, in the substrate W that is transported to the one spin chuck 25a to 25d by the transport mechanism 127, the center WC coincides with the rotational center 25C in the spin chuck 25 and the notch NT is directed in the constant direction. In this state, the substrate W is supported by the spin chuck 25.

In this case, it is not necessary to perform the teaching on the transport mechanism 127 for the coincidence of the center WC of the substrate W with the rotational center 25C of each spin chuck 25a to 25d. Therefore, a large amount of time, which an operator conventionally requires for the teaching operation, can be reduced, and work efficiency of the substrate processing apparatus 100 can be improved. Further, the substrate W can be transported to each spin chuck 25a to 25d such that deviation between the substrate W and each spin chuck 25a to 25d is reduced regardless of a distance of transportation of the transport mechanism 127.

Further, the processing is performed on the substrate W that is rotated by each spin chuck 25a to 25d with the center WC of the substrate W coinciding with the rotational center 25C of each spin chuck 25a to 25d and the notch NT being directed in the constant direction. Thus, accuracy of the processing for the substrate W can be improved, and the accuracy of the processing for the plurality of substrates W can be uniform.

[2] Second Embodiment

While the position at which the substrate W is to be supported is the center of the rotation holding device such as the spin chuck in the first embodiment, the invention is not limited to this. The position at which the substrate W is to be supported may be a thermal processing unit and the like that does not have the rotation holding device. In the second embodiment, alignment for the substrate W that is transported to the thermal processing unit is performed by the aligner. As for the substrate processing apparatus according to the second embodiment, differences from the substrate processing apparatus 100 according to the first embodiment will be described below.

Figure 17A:
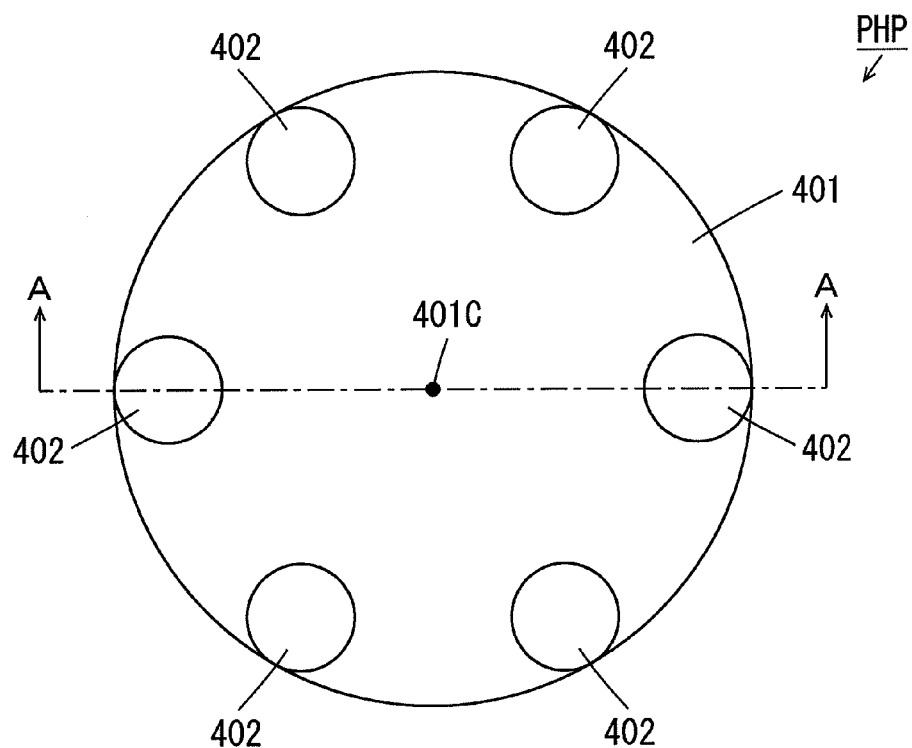
FIGS. 17A to 17C are diagrams showing a configuration of a thermal processing unit.
Figure 17B:
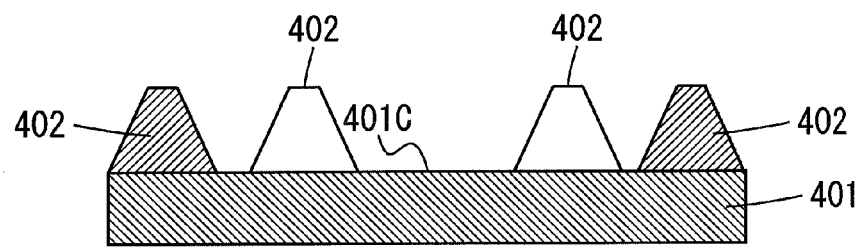
Figure 17C:
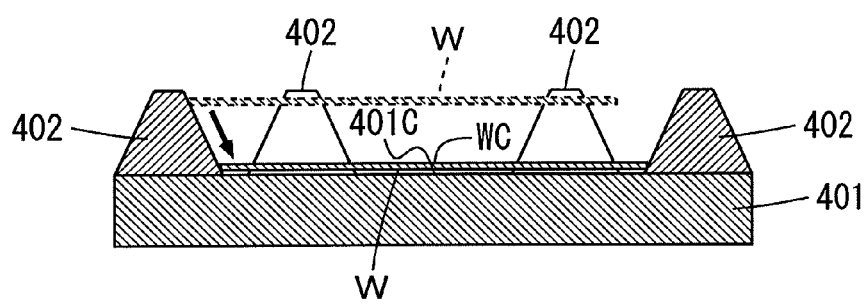

FIGS. 17A, 17B, 17C are diagrams showing a configuration of the thermal processing unit PHP. FIG. 17A is a plan view of the thermal processing unit PHP, and FIG. 17B is a cross sectional view taken along the line A-A of the thermal processing unit PHP of FIG. 17A. As shown in FIG. 17A, the thermal processing unit PHP includes a heater 401 and a plurality of guide members 402. The heater 401 is a disk-shaped hot plate. The plurality of guide members 402 are provided along an edge of the heater 401 at substantially equal intervals. In the example of FIG. 17A, the six guide members 402 are provided at intervals of substantially 60°.

As shown in FIG. 17B, each guide member 402 has a truncated cone shape. When the substrate W is arranged in a region that is surrounded by the plurality of guide members 402, the substrate W is led downward along inclined side surfaces of the guide members 402 as indicated by the arrow in FIG. 17C. Thus, with a supporting center 401C of the heater 401 coinciding with the center WC of the substrate W, the substrate W is supported above the heater 401.

In the present embodiment, the aligner AL is further provided in the interface block 14 of FIG. 1. The aligner AL is arranged above the substrate platform PASS9 of FIG. 4, for example. Steps of acquiring the correction information for performing the alignment for the substrate W that is transported from the aligner AL in the interface block 14 to the thermal processing unit PHP in the upper thermal processing section 303 of the second processing block 13 of FIG. 3 will be described below.

Figure 18:
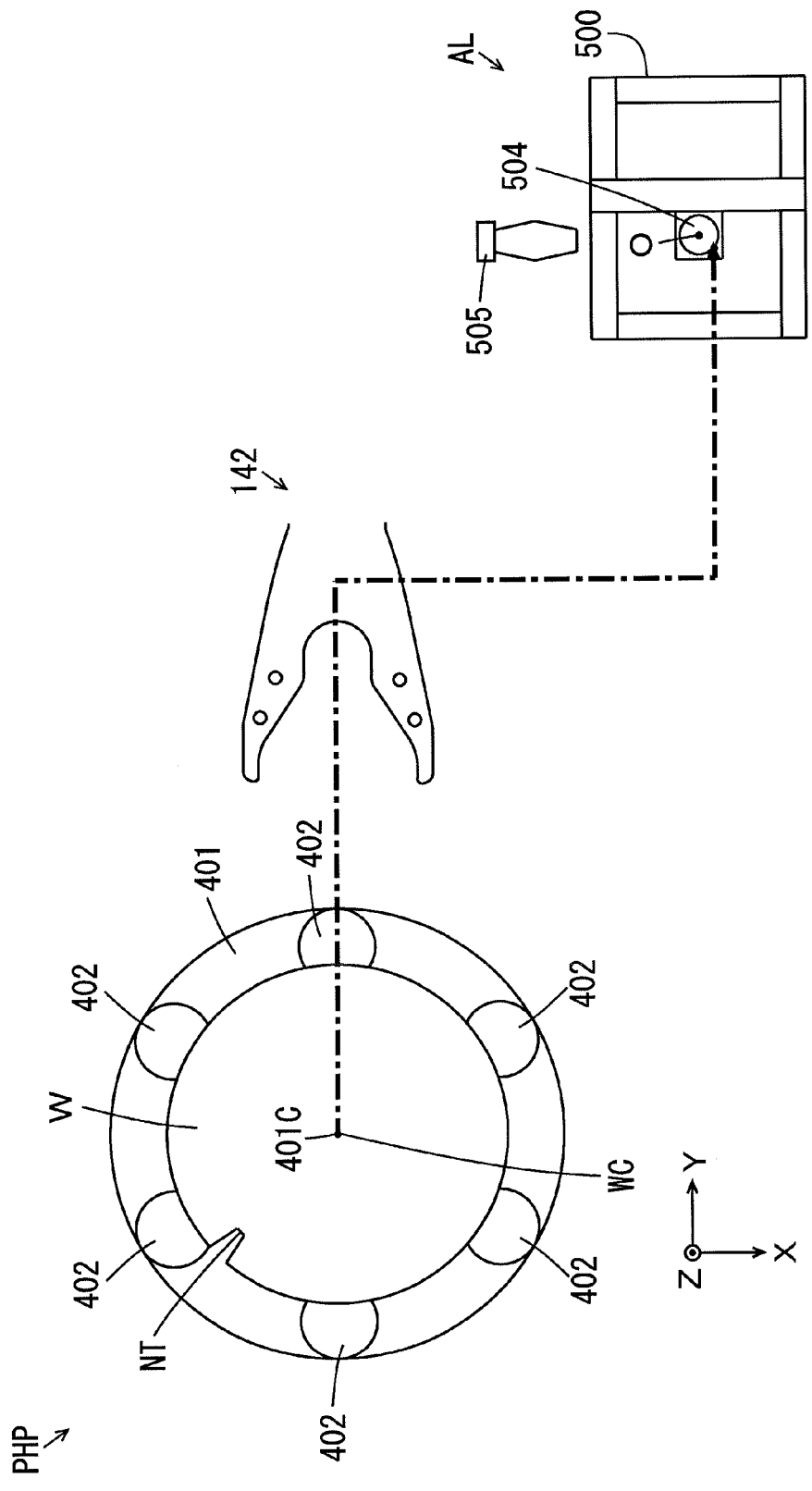
FIG. 18 is a diagram for explaining steps of acquiring the correction information in a second embodiment.

FIGS. 18 and 19 are diagrams for explaining steps of acquiring the correction information in the second embodiment. First, as shown in FIG. 18, with the supporting center 401C of the heater 401 coinciding with the center WC of the substrate W, the substrate W is supported in the thermal processing unit PHP. In this case, the supporting center 401C of the heater 401 is equivalent to the reference position. Here, the substrate W may be supported in the thermal processing unit PHP by the transfer of the substrate W from the aligner AL to the thermal processing unit PHP by the transport mechanism 142. Alternatively, the substrate W may be supported in the thermal processing unit PHP by a user of the substrate processing apparatus 100.

Next, as indicated by a one-dotted dashed arrow in FIG. 18, the substrate W is moved by a predetermined constant distance in the +X direction and is moved by a predetermined constant distance in the +Y direction by the transport mechanism 142. Thus, as shown in FIG. 19, the substrate W is transported from the thermal processing unit PHP to the aligner AL. The position of the center WC of the substrate W at this time is a correction position P0.

Here, the rotation axis RA of the rotation holding device 504 coincides with the origin position O. The X offset amount Xoff and the Y offset amount Yoff of the substrate W are calculated, so that the correction position P0 is calculated. In this case, coordinates of the correction position P0 are (Xoff, Yoff). The respective correction positions P0 corresponding to the plurality of other respective thermal processing units PHP are calculated by the similar steps. The plurality of respective calculated correction positions P0 are stored in the memory 506 of FIG. 9 as the plurality of respective correction information. The correction information may include the constant value of the rotation direction offset amount θoff corresponding to the thermal processing unit PHP as the correction direction.

Next, the alignment for the substrate W by the aligner AL during the processing for the substrate W will be described. First, the transport mechanism 142 (FIG. 1) sequentially transports the substrate W after the exposure processing that is placed on the substrate platform PASS9 (FIG. 4) to the cleaning drying processing unit SD2 and the aligner AL.

In an initial state, the rotation axis RA of the rotation holding device 504 coincides with the origin position O. In this state, the substrate W on which the cleaning drying processing is performed is held by the rotation holding device 504. Here, the X offset amount Xoff, the Y offset amount Yoff and the rotation direction offset amount θoff of the substrate W are calculated. Thus, the direction of the center WC and the notch NT of the substrate W are detected.

Subsequently, the substrate W is rotated by the rotation holding device 504 in the aligner AL based on the correction information stored in the memory 506 of FIG. 9 such that the rotation direction offset amount θoff is the constant value. Here, the constant value of the rotation direction offset amount θoff is included in the correction information as the correction direction. Further, the correction position P0 is acquired based on the correction information stored in the memory 506 of FIG. 9. The substrate W is moved in the X and Y directions by the moving device 500 such that the center WC of the rotated substrate W coincides with the acquired correction position P0.

Thereafter, the substrate W is moved by a predetermined constant distance in the +X direction and is moved by a predetermined constant distance in the +Y direction by the transport mechanism 142. Thus, the substrate W is supported in the thermal processing unit PHP with the direction of the notch NT being constant and the supporting center 401C of the heater 401 of the thermal processing unit PHP coinciding with the center WC of the substrate W. In this state, PEB processing is performed on the substrate W.

In the transportation of the above-mentioned substrate W, the alignment for the substrate W is performed by the aligner AL based on the correction information corresponding to the position at which the substrate W is to be supported. Specifically, the alignment for the substrate W for the coincidence of the supporting center 401C of the heater 401 of the thermal processing unit PHP with the center WC of the substrate W is performed based on the correction information.

Therefore, the supporting center 401C of the heater 401 can coincide with the center WC of the substrate W in the thermal processing unit PHP. Thus, accuracy of the PEB processing for the substrate W can be improved. Further, because the processing is performed on the substrate W with the direction of the notch NT being constant, accuracy of the PEB processing for the plurality of substrates W can be uniform. Further, because the processing is performed on the substrate W with the direction of the notch NT being constant, when a malfunction occurs in the PEB processing for the substrate W, it is easier to perform analysis of the cause.

[3] Other Embodiments (1) While the transport mechanism 127, 128, 137, 138, 142 is a transport robot that can freely transport the substrate W in the X, Y and Z directions in the first and second embodiments, the invention is not limited to this. The transport mechanism 127, 128, 137, 138, 142 may be a single-axis robot (an electric slider) that can transport the substrate W in one direction. Alternatively, the transport mechanism 127, 128, 137, 138, 142 may be a cylindrical coordinate robot.

In a case in which the transport mechanism 127, 128, 137, 138, 142 is any one of these robots, even when the teaching is performed on the transport mechanism 127, 128, 137, 138, 142, the direction of the notch NT cannot coincide with a specific direction with respect to the center of the substrate W. However, the alignment for the substrate W is performed in advance in the aligner AL, so that the direction of the notch NT can coincide with the specific direction with respect to the center of the substrate W using the single-axis robot or the cylindrical coordinate robot.

(2) The alignment is performed such that the direction of the notch NT coincides with the specific direction with respect to the center WC of the substrate W, and the alignment is performed such that the center WC of the substrate W coincides with the specific position in the first and second embodiments. However, the invention is not limited to this. When it is not necessary to unify the directions of the notches NT of the plurality of substrates W, the alignment may be performed such that the center WC of the substrate W coincides with a specific position without the coincidence of the direction of the notch NT with the specific direction with respect to the center WC of the substrate W.

(3) While the plurality of correction information CIa to CId respectively corresponding to the plurality of spin chucks 25a to 25d are stored in the memory 506 of the aligner AL in the first and second embodiments, the invention is not limited to this. The one correction information corresponding to the one spin chuck 25 may be stored in the memory 506 of the aligner AL.

(4) While the substrate W is rotated by 180° by the spin chuck during the acquisition of the correction information of FIG. 11 in the first embodiment, the invention is not limited to this. The substrate W may be rotated by the spin chuck by any angle during the acquisition of the correction information of FIG. 11. In this case, the correction position P0 of FIG. 13 can be calculated by a geometric operation based on the position of the center WC before the rotation of the substrate W and the position of the center WC after the rotation of the substrate W.

[4] Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiments, the substrate W is an example of a substrate, the substrate processing apparatus 100 is an example of a substrate processing apparatus and the rotational center 25C or the supporting center 401C is an example of a reference position. The coating processing chamber 21 to 24, the edge exposure unit EEW or the thermal processing unit PHP is an example of a substrate supporter, the aligner AL is an example of a position adjuster and the transport mechanism 127, 128, 137, 138, 142 is an example of a transport device.

The correction information CIa to CId is an example of correction information, the memory 506 is an example of a storage, the controller 510 is an example of a controller, the correction position P0 is an example of a correction position and the spin chuck 25 is an example of a first rotation holding device. The guide member 402 is an example of a guide mechanism, the rotation holding device 504 is an example of a substrate holder or a second rotation holding device, the moving device 500 is an example of a moving device and the line sensor 505 is an example of a position detector and the notch NT is an example of a notch.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for processing various types of substrates.

I claim:

1. A substrate processing method for performing processing on a substrate, comprising the steps of:
storing in a storage one or plurality of correction information, corresponding to one or plurality of substrate supporters, acquired in advance for adjustment of a position of the substrate by a position adjustor;
adjusting the position of the substrate by the position adjustor based on the correction information, corresponding to one substrate supporter, of the one or plurality of correction information stored in the storage before the substrate is transported from the position adjustor to one substrate supporter of the one or plurality of substrate supporters during the processing for the substrate; and
transporting the substrate of which the position is adjusted by the position adjustor to the one substrate supporter by a transport device, wherein
each of the one or plurality of correction information indicates the position to be adjusted by the position adjustor when the substrate is transported to each of the one or plurality of substrate supporters from the position adjustor by the transport device in order for a center of the transported substrate to coincide with a reference position in the substrate supporter,
the position adjustor has a rotation axis and is configured to detect an amount of deviation between the center of the substrate that is carried in and the rotation axis, and
the step of storing the one or plurality of correction information in the storage includes
transporting the substrate from each of the one or plurality of substrate supporters to the position adjustor by the transport device during acquisition of the correction information,
acquiring the amount of deviation detected by the position adjustor after the transportation from the substrate supporter to the position adjustor, and acquiring correction information based on the acquired amount of deviation during acquisition of the correction information, and
storing the acquired one or plurality of correction information corresponding to the one or plurality of substrate supporters in the storage during acquisition of the correction information.

2. The substrate processing method according to claim 1, wherein each of the one or plurality of correction information includes a position with which the center of the substrate is to coincide in the position adjustor before the transportation of the substrate to each of the one or plurality of substrate supporters as a correction position, and
the step of adjusting the position of the substrate includes adjusting the position of the substrate by the position adjustor such that the center of the substrate coincides with the correction position corresponding to the one substrate supporter before the transportation of the substrate to the one substrate supporter.

3. The substrate processing method according to claim 2, wherein the position adjustor includes a substrate holder that holds the substrate,
a moving device that moves the substrate holder in a two-dimensional direction that is orthogonal to the rotation axis, and
a position detector that detects a position of an outer periphery of the substrate held by the substrate holder, and
the step of adjusting the position of the substrate includes
calculating a position of the center of the substrate based on the position of the outer periphery of the substrate detected by the position detector before the transportation of the substrate to the one substrate supporter, and
adjusting the position of the substrate by the moving device based on the calculated position of the center of the substrate such that the center of the substrate held by the substrate holder coincides with the correction position corresponding to the one substrate supporter before the transportation of the substrate to the one substrate supporter.

4. The substrate processing method according to claim 2, wherein each of the one or plurality of substrate supporters has a preset reference direction,
the position adjustor is configured to be capable of adjusting a direction of the substrate that is carried in about the rotation axis, and
each of the one or plurality of correction information includes a direction to be adjusted by the position adjustor when the substrate is transported to each of the one or plurality of substrate supporters from the position adjustor in order for a direction of the transported substrate to coincide with the reference direction in the substrate supporter.

5. The substrate processing method according to claim 4, wherein each of the one or plurality of correction information includes a direction with which a direction of a notch of the substrate is to coincide in the position adjustor before the transportation of the substrate to each of the one or plurality of substrate supporters as a correction direction, and
the step of adjusting the position of the substrate includes adjusting the direction of the substrate by the position adjustor such that the direction of the notch of the substrate coincides with the correction direction corresponding to the one substrate supporter, before the transportation of the substrate to the one substrate supporter.

6. The substrate processing method according to claim 5, wherein the position adjustor includes
a second rotation holding device that holds the substrate in a horizontal attitude and rotates the substrate about the rotation axis,
a moving device that moves the second rotation holding device in a two-dimensional direction that is orthogonal to the rotation axis, and
a position detector that detects a position of an outer periphery of the substrate rotated by the second rotation holding device, and
the step of adjusting the position of the substrate includes
calculating the position of the center of the substrate and the direction of the notch of the substrate based on the position of the outer periphery of the substrate detected by the position detector before the transportation of the substrate to the one substrate supporter, and
adjusting the position of the substrate and the direction of the substrate by the second rotation holding device and the moving device based on the calculated position of the center of the substrate and the calculated direction of the notch of the substrate such that the center of the substrate held by the second rotation holding device coincides with the correction position corresponding to the one substrate supporter, and such that the direction of the notch of the substrate held by the second rotation holding device coincides with the correction direction corresponding to the one substrate supporter, before the transportation of the substrate to the one substrate supporter.

7. A substrate processing method for performing processing on a substrate, comprising the steps of:
storing in a storage one or plurality of correction information, corresponding to one or plurality of substrate supporters, acquired in advance for adjustment of a position of the substrate by a position adjustor;
adjusting the position of the substrate by the position adjustor based on the correction information, corresponding to one substrate supporter, of the one or plurality of correction information stored in the storage before the substrate is transported from the position adjustor to the one substrate supporter of the one or plurality of substrate supporters during the processing for the substrate; and
transporting the substrate of which the position is adjusted by the position adjustor to the one substrate supporter by a transport device, wherein
each of the one or plurality of correction information indicates the position to be adjusted by the position adjustor when the substrate is transported to each of the one or plurality of substrate supporters from the position adjustor by the transport device in order for a center of the transported substrate to coincide with a reference position in the substrate supporter,
each of the one or plurality of correction information includes a position with which the center of the substrate is to coincide in the position adjustor before the transportation of the substrate to each of the one or plurality of substrate supporters as a correction position,
each of the one or plurality of substrate supporters includes a first rotation holding device that holds the substrate in a horizontal attitude and rotates the substrate about a rotation axis,
the position adjustor has a rotation axis and is configured to detect an amount of deviation between the center of the substrate that is carried in and the rotation axis,
the step of storing the one or plurality of correction information in the storage includes
transporting the substrate from the position adjustor to each substrate supporter by the transport device during acquisition of the correction information,
rotating the transported substrate by a predetermined angle by the first rotation holding device during acquisition of the correction information,
transporting the substrate from the substrate supporter to the position adjustor by the transport device during acquisition of the correction information,
detecting an amount of deviation detected by the position adjustor before the transportation from the position adjustor to each substrate supporter as a first amount of deviation during acquisition of the correction information,
detecting an amount of deviation detected by the position adjustor after the transportation from the substrate supporter to the position adjustor as a second amount of deviation during acquisition of the correction information, calculating the correction position based on the first and second amounts of deviation during acquisition of the correction information, and storing the calculated one or plurality of correction positions, corresponding to the one or plurality of substrate supporters, in the storage during acquisition of the correction information, and the step of adjusting the position of the substrate includes adjusting the position of the substrate by the position adjustor such that the center of the substrate coincides with the correction position corresponding to the one substrate supporter before the transportation of the substrate to the one substrate supporter.

8. The substrate processing method according to claim 7, wherein the predetermined angle is 180 degrees.

9. The substrate processing method according to claim 7, wherein each of the one or plurality of substrate supporters is configured to perform the processing on the substrate rotated by the first rotation holding device during the processing for the substrate.

10. A substrate processing method for performing processing on a substrate, comprising the steps of:

storing in a storage one or plurality of correction information, corresponding to one or plurality of substrate supporters, acquired in advance for adjustment of a position of the substrate by a position adjustor;

adjusting the position of the substrate by the position adjustor based on the correction information, corresponding to one substrate supporter, of the one or plurality of correction information stored in the storage before the substrate is transported from the position adjustor to one substrate supporter of the one or plurality of substrate supporters during the processing for the substrate; and transporting the substrate of which the position is adjusted by the position adjustor to the one substrate supporter by a transport device, wherein each of the one or plurality of correction information indicates the position to be adjusted by the position adjustor when the substrate is transported to each of the one or plurality of substrate supporters from the position adjustor by the transport device in order for a center of the transported substrate to coincide with a reference position in the substrate supporter, each of the one or plurality of correction information includes a position with which the center of the substrate is to coincide in the position adjustor before the transportation of the substrate to each of the one or plurality of substrate supporters as a correction position, each of the one or plurality of substrate supporters includes a guide mechanism that leads a position of the center of the substrate to the reference position, the position adjustor has a rotation axis and is configured to detect an amount of deviation between the center of the substrate that is carried in and the rotation axis, the step of storing the one or plurality of correction information in the storage includes leading the position of the center of the substrate to the reference position by the guide mechanism in each of the one or plurality of substrate supporters during acquisition of the correction information, transporting the substrate led to the reference position from each of the one or plurality of substrate supporters to the position adjustor by the transport device during acquisition of the correction information, acquiring an amount of deviation detected by the position adjustor after the transportation of the substrate from the substrate supporter to the position adjustor during acquisition of the correction information, calculating the correction position based on the acquired amount of deviation during acquisition of the correction information, and storing the calculated one or plurality of correction positions corresponding to the one or plurality of substrate supporters in the storage during acquisition of the correction information, and the step of adjusting the position of the substrate includes adjusting the position of the substrate by the position adjustor such that the center of the substrate coincides with the correction position corresponding to the one substrate supporter before the transportation of the substrate to the one substrate supporter.

11. The substrate processing method according to claim 10, wherein each of the one or plurality of substrate supporters is configured to perform temperature processing on the substrate during the processing for the substrate.

* * * * *